(12) United States Patent
Morita et al.

(10) Patent No.: US 7,595,680 B2
(45) Date of Patent: Sep. 29, 2009

(54) BIDIRECTIONAL SWITCH AND METHOD FOR DRIVING THE SAME

(75) Inventors: Tatsuo Morita, Kyoto (JP); Manabu Yanagihara, Osaka (JP); Hidetoshi Ishida, Osaka (JP); Yasuhiro Uemoto, Shiga (JP); Manabu Inoue, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/020,163

(22) Filed: Jan. 25, 2008

(65) Prior Publication Data

US 2008/0211567 A1    Sep. 4, 2008

(30) Foreign Application Priority Data

Jan. 25, 2007    (JP) .............................. 2007-014585

(51) Int. Cl.
*H03K 17/687* (2006.01)
(52) U.S. Cl. .................. 327/427; 327/432; 327/434
(58) Field of Classification Search ................ 327/427, 327/432, 332, 434
See application file for complete search history.

(56) References Cited

U.S. PATENT DOCUMENTS 5,617,057 A * 4/1997 Rees et al. .................. 327/543

| | | | |
|---|---|---|---|
| 6,977,513 B2 * | 12/2005 | Matsunaga | .................. 324/713 |
| 7,038,252 B2 | 5/2006 | Saito et al. | |
| 2005/0189561 A1 | 9/2005 | Kinzer et al. | |
| 2006/0145746 A1 * | 7/2006 | Metzler | ...................... 327/427 |

FOREIGN PATENT DOCUMENTS

| JP | 11-261053 | 9/1999 |
|---|---|---|
| JP | 2004-273486 | 9/2004 |

* cited by examiner

*Primary Examiner*—Lincoln Donovan
*Assistant Examiner*—Daniel Rojas
(74) *Attorney, Agent, or Firm*—McDermott Will & Emery LLP

(57) ABSTRACT

A bidirectional switch includes a field-effect transistor having a first ohmic electrode, a second ohmic electrode and a gate electrode, and a control circuit for controlling between a conduction state and a cut-off state by applying a bias voltage to the gate electrode. The control circuit applies the bias voltage from the first ohmic electrode as a reference when a potential of the second ohmic electrode is higher than the potential of the first ohmic electrode, and applies the bias voltage from the second ohmic electrode as a reference when the potential of the second electrode is lower than the potential of the first ohmic electrode.

11 Claims, 12 Drawing Sheets

BIDIRECTIONAL SWITCH AND METHOD FOR DRIVING THE SAME

CROSS-REFERENCE TO RELATED APPLICATION

This application claims priority under 35 U.S.C. 119 on Patent Application No. 2007-014585 filed in Japan on Jan. 25, 2007, the entire contents of which are herby incorporated by reference. The entire contents of Patent Application No. 2007-277416 filed in Japan on Oct. 25, 2007 are also incorporated by reference.

BACKGROUND OF THE INVENTION

1. Field of the Invention

The present invention relates to a bidirectional switch and a method for driving the bidirectional switch.

2. Description of the Prior Art

As power switching semiconductor devices, a power MOSFET (metal oxide film semiconductor field-effect transistor), an IGBT (insulated-gate bipolar transistor), a thyristor and the like are known. When a switching circuit conducting a bidirectional current using such semiconductor devices is formed, each of the semiconductor devices has to have a bidirectional breakdown voltage. To have a bidirectional breakdown voltage means to have a breakdown voltage with respect to both positive and negative voltages.

A power MOSFET and an IGBT each have, in general, a low reverse blocking capability. Therefore, for example, to realize a bidirectional switch using an IGBT, as shown in FIG. 13, it is necessary to connect two IGBTs in parallel and in a direction opposite to each other and connect diodes to the IGBTs in series, respectively. In FIG. 13, an IGBT 201 and a diode 202 are connected to each other in an opposite direction to the direction in which an IGBT 203 and a diode 204 are connected. Thus, by turning the IGBT 201 and the IGBT 203 both ON, a current flows bidirectionally, and by turning the IGBT 201 and the IGBT 203 both OFF, a high breakdown voltage for both polarities can be achieved.

In a semiconductor device for performing such bidirectional switching, it is important to reduce switching loss determined according to a product of transitional voltage and current generated at a time of switching and conduction loss resulting from power consumption by a resistance (referred to as an "ON resistance") of the semiconductor device in an ON state. However, it is difficult to reduce an ON resistance of a bidirectional switching circuit formed using a semiconductor device made of silicon (Si) because of material limits of Si.

To overcome material limits and reduce conduction loss, introduction of a semiconductor device using a wide-band-gap semiconductor such as nitride semiconductor represented by GaN, silicon carbide (SiC) or the like has been examined. Wide-band-gap semiconductor has a breakdown electric field which is higher by approximately 1 digit order, compared to Si. Specifically, due to spontaneous polarization and piezopolarization, charges are generated at a hetero junction interface of aluminum gallium nitride (AlGaN) and gallium nitride (GaN). Thus, even in an undoped state, a two-dimensional electron gas (2DEG) layer having a high sheet carrier concentration of $1\times10^{13}$ cm$^{-2}$ or more and a high mobility of 1000 cm$^2$V/sec or more is formed. Therefore, an AlGaN/GaN hetero junction field-effect transistor (AlGaN/GaN-HFET) is expected as a power switching transistor for realizing low ON resistance and high breakdown voltage.

However, in a regular FET, a breakdown voltage between gate and source is lower than a breakdown voltage between gate and drain. Therefore, even a FET using wide-band-gap semiconductor needs two FETs and two protective diodes to realize a bidirectional switch.

To equalize a breakdown voltage between gate and source voltage with a breakdown voltage between gate and drain, a distance between a gate electrode and a source electrode can be equalized with a distance between the gate electrode and a drain electrode. Use of a FET in which a breakdown voltage between gate and drain is equalized with a breakdown voltage between gate and source in a bidirectional switching circuit in the above manner has been proposed (see, for example, Specification of U.S. Patent Application No. 2005/0189561).

However, even when a breakdown voltage between gate and drain is equalized with a breakdown voltage between gate and source, a high breakdown voltage of a bidirectional switch can not be realized. In a typical FET, a current flowing from a drain electrode to a source electrode is controlled by applying a voltage between a gate electrode and the source electrode. But even though a voltage is applied between the gate electrode and the source electrode, a current flowing from the source electrode to the drain electrode can not be controlled. Therefore, a bidirectional switch in which a current flowing bidirectionally between the source electrode and the drain electrode has to be controlled can not be realized when only one FET is provided.

SUMMARY OF THE INVENTION

It is therefore an object of the present invention to solve the above-described problems and to realize a bidirectional switch in which in a FET including a first ohmic electrode and a second ohmic electrode of which one is serving as a source electrode and the other serves as a drain electrode, a current flowing from the first ohmic electrode to the second ohmic electrode and a current flowing from the second ohmic electrode to the first ohmic electrode are controlled so that the bidirectional switch is capable of making a current flow at least in one direction and cutting off a bidirectional current.

To achieve the above-described object, the present invention provides a bidirectional switch having a configuration in which a bias voltage is applied to the gate electrode using, as a reference, the potential of the first ohmic electrode or the potential of the second ohmic electrode according to respective potentials of the first ohmic electrode and the second ohmic electrode.

Specifically, a bidirectional switch according to the present invention is subjected to a bidirectional switch for controlling between a conduction state in which a current flows at least in one direction between a first terminal and a second terminal and a cut-off state in which a bidirectional current does not flow therebetween, and is characterized by including: a field-effect transistor including a first ohmic electrode and a second ohmic electrode of which one serves as a source electrode and the other serves as a drain electrode and a gate electrode formed between the first ohmic electrode and the second ohmic electrode, the first ohmic electrode being connected to the first terminal, the second ohmic electrode being connected to the second terminal; and a control circuit for applying a bias voltage to the gate electrode to control between the conduction state and the cut-off state, and is characteristics in that the control circuit applies the bias voltage from the first ohmic electrode as a reference when a potential of the second ohmic electrode is higher than the potential of the first ohmic electrode and applies the bias voltage from the second ohmic electrode as a reference when the potential of the second ohmic electrode is lower than the potential of the first ohmic electrode.

Thus, in the bidirectional switch of the present invention, the control circuit applies the bias voltage using the first ohmic electrode as a reference when the potential of the second ohmic electrode is higher than the potential of the first ohmic electrode, and applies the bias voltage from the second ohmic electrode as a reference when the potential of the second ohmic electrode is lower than the potential of the first ohmic electrode. Accordingly, both of a current flowing from the second ohmic electrode to the first ohmic electrode and a current flowing from the first ohmic electrode to the second ohmic electrode can be controlled. Therefore, a bidirectional switch conducting a current at least in one direction between the first ohmic electrode and the second ohmic electrode and cutting off a bidirectional current flowing therebetween can be realized by a single FET.

A method for driving a bidirectional switch according to the present invention is subjected to a method for driving a bidirectional switch including a field-effect transistor having a first ohmic electrode and a second ohmic electrode of which one serves as a source electrode and the other serves as a drain electrode and a gate electrode formed between the first ohmic electrode and the second ohmic electrode, and is characterized by including the steps of: comparing a potential of the second electrode with a potential of the first ohmic electrode; and applying a bias voltage to a gate electrode of the field-effect transistor from the first ohmic electrode as a reference when the potential of the second ohmic electrode is higher than the potential of the first ohmic electrode and applying the bias voltage to the gate electrode from the second ohmic electrode as a reference when the potential of the second ohmic electrode is lower than the potential of the first ohmic electrode, and is characterized in that the bias voltage is a higher voltage than a threshold voltage of the field-effect transistor in a conduction state in which a current flows at least in one direction between a first terminal and a second terminal and is a voltage lower than the threshold voltage in a cut-off state in which a current does not flow therebetween.

The method for driving a bidirectional switch according to the present invention includes the step of applying a bias voltage to a gate electrode of a field-effect transistor from a first ohmic electrode as a reference when a potential of the second ohmic electrode is higher than the potential of the first ohmic electrode, and applies the bias voltage to the gate electrode from the second ohmic electrode as a reference when the potential of the second ohmic electrode is lower than the potential of the first ohmic electrode. Thus, both of a current flowing from the second ohmic electrode to the first ohmic electrode and a current flowing from the first ohmic electrode to the second ohmic electrode can be controlled. Therefore, a bidirectional switch conducting a current at least in one direction between the first ohmic electrode and the second ohmic electrode and cutting off a bidirectional current flowing therebetween can be realized by a single FET.

DESCRIPTION OF THE PREFERRED EMBODIMENTS

First Embodiment

Figure 1:
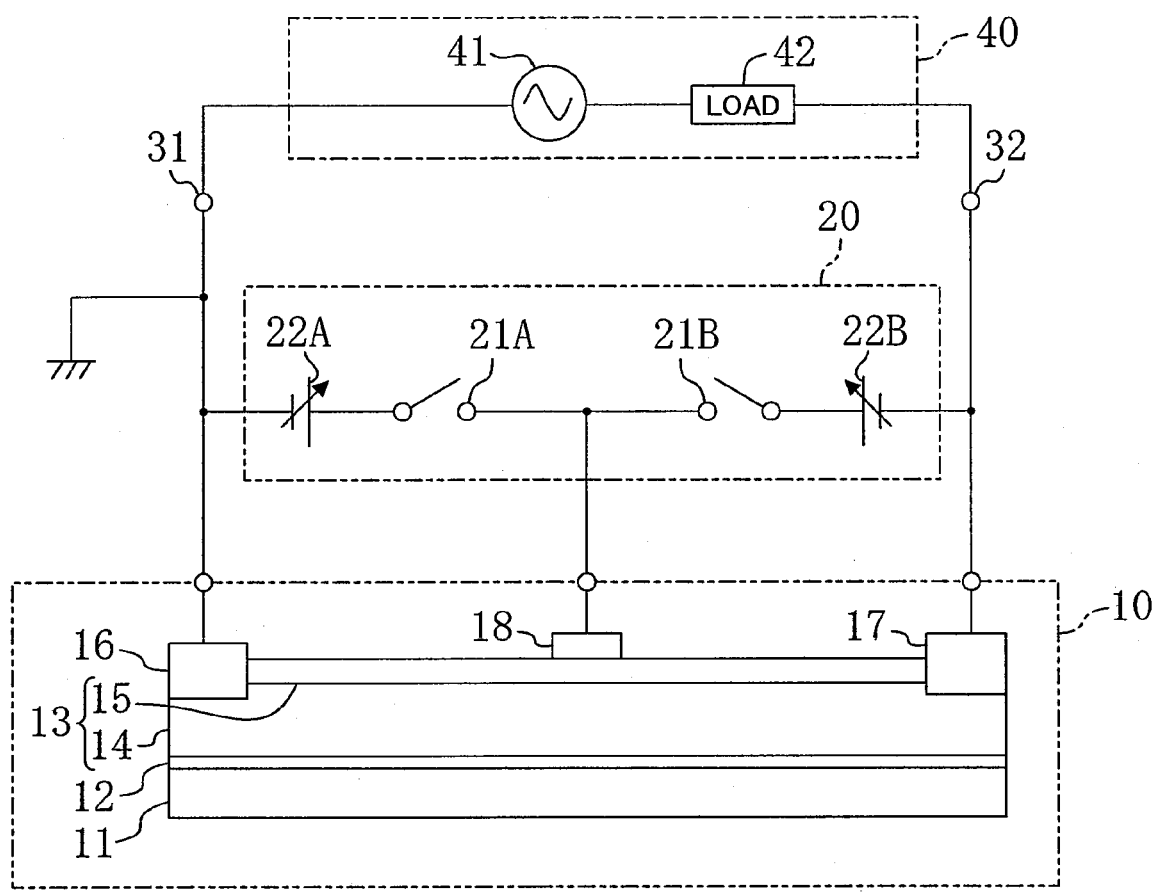
FIG. 1 is a diagram illustrating a bidirectional switch according to a first embodiment of the present invention.

A first embodiment of the present invention will be described with reference to the accompanying drawings. FIG. 1 is a diagram illustrating a circuit configuration of a bidirectional switch according to the first embodiment. As shown in FIG. 1, the bidirectional switch according to this embodiment includes a field-effect transistor (FET) 10 and a control circuit 20 for controlling the FET 10 and performs control between a conduction state in which a current flows at least in one direction between the first terminal 31 and the second terminal 32 and a cut-off state in which a current does not flow therebetween. In FIG. 1, an example where a load circuit 40 including a bidirectional power supply 41 and a load 42 connected in series is connected between the first terminal 31 and the second terminal 32 is shown.

A control circuit 20 is connected to a first ohmic electrode 16, a gate electrode 18 and a second ohmic electrode 17 of the FET 10. When a potential of the second ohmic electrode 17 is higher than a potential of the first ohmic electrode 16, the control circuit 20 applies a gate bias voltage to the gate electrode 18 from the first ohmic electrode 16 as a reference to control a current flowing from the second ohmic electrode 17 to the first ohmic electrode 16. When the potential of the second ohmic electrode 17 is lower than the potential of the first ohmic electrode 16, the control circuit 20 applies a gate bias voltage to the gate electrode 18 from the second ohmic electrode 17 as a reference to control a current flowing from the first ohmic electrode 16 to the second ohmic electrode 17. With the above-described configuration and operation, a bidirectional current flowing between the first ohmic electrode 16 and the second ohmic electrode 17 of the FET 10 can be controlled.

The FET 10 of this embodiment is not particularly limited, but the following structure may be used as the FET 10. A buffer layer 12 in which aluminum nitride (AlN) having a thickness of 10 nm and gallium nitride (GaN) having a thickness of 10 nm alternately are stacked and which has a thickness of 1 µm is formed on a substrate 11 of silicon having a principal surface with a (111) plane direction and a semiconductor layer 13 is formed on the buffer layer 12. In the semiconductor layer 13, an undoped GaN layer 14 having a thickness of 2 µm and an AlGaN layer 15 which has a thickness of 20 nm and in which Si is doped are stacked. A two-dimensional electron gas (2DEG) layer is generated at an interface of the GaN layer 14 with the AlGaN layer 15.

On the semiconductor layer 13, the first ohmic electrode 16 and the second ohmic electrode 17, each of which is formed of titanium (Ti) and aluminum (Al), are provided so as to be spaced apart from each other. One of the first ohmic electrode 16 and the second ohmic electrode 17 serves as a source electrode and the other thereof serves as a drain electrode. Each of the first ohmic electrode 16 and the second ohmic electrode 17 is formed in part of the semiconductor layer 13 from which the AlGaN layer 15 has been removed and which extends to a depth of about 40 nm from a top surface of the GaN layer 14. A gate electrode 18 is formed of palladium (Pd) and gold (Au) on the semiconductor layer 13 so as to be located between the first ohmic electrode 16 and the second ohmic electrode 17.

With the above-described structure, a hetero junction FET (HFET) of which a threshold voltage is about −2 V can be realized. Moreover, by equalizing a distance between the gate electrode 18 and the first ohmic electrode 16 with a distance between the gate electrode 18 and the second ohmic electrode 17, a breakdown voltage between the gate electrode 18 and the first ohmic electrode 16 can be equalized with a breakdown voltage between the gate electrode 18 and the second ohmic electrode 17.

Although it is preferable that the distance between the second ohmic electrode and the gate electrode and the distance between the first ohmic electrode and the gate electrode are equal to each other, the distances may be unequal as long as a desired bidirectional breakdown voltage is achieved. Moreover, by stating that the distance between the second ohmic electrode and the gate electrode and the distance between the first ohmic electrode and the gate electrode are equal, it is meant that in actual device fabrication process steps, the distances are equal in the terms of alignment precision in photolithography. Specifically, the alignment accuracy is about ±1 µm, and a margin of error of about ±1 µm is allowed for the distance between the second ohmic electrode and the gate electrode and the distance between the first ohmic electrode and the gate electrode.

The first ohmic electrode 16 of the FET 10 is connected to the first terminal 31 and also is grounded. The second ohmic electrode 17 is connected to the second terminal 32. The gate electrode 18 is connected to an output of the control circuit 20.

The control circuit 20 includes a first power supply 22A connected between the first ohmic electrode 16 and the gate electrode 18 via a first switch 21A and a second power supply 22B connected between the second ohmic electrode 17 and the gate electrode 18 via a second switch 21B.

Each of the first power supply 22A and the second power supply 22B is a variable power supply which outputs a higher voltage than a threshold voltage of the FET 10 in a conduction state in which a bidirectional current flows between the first ohmic electrode 16 and the second ohmic electrode 17 and outputs a voltage lower than the threshold voltage in a cut-off state in which a current does not flow between the first ohmic electrode 16 and the second ohmic electrode 17.

The first switch 21A is turned ON when the potential of the second ohmic electrode 17 is higher than the potential of the first ohmic electrode 16 and is turned OFF when the potential of the second ohmic electrode 17 is lower than the potential of the first ohmic electrode 16. On the other hand, the second switch 21B is turned OFF when the potential of the second ohmic electrode 17 is higher than the potential of the first ohmic electrode 16 and is turned ON when the potential of the second ohmic electrode 17 is lower than the potential of the first ohmic electrode 16. Accordingly, when the potential of the second ohmic electrode 17 is higher than the potential of the first ohmic electrode 16, the gate electrode 18 is connected to the first power supply 22A and a voltage is applied between the first ohmic electrode 16 and the gate electrode 18. When the potential of the second ohmic electrode 17 is lower than the potential of the first ohmic electrode 16, the gate electrode 18 is connected to the second power supply 22B and a voltage is applied between the second ohmic electrode 17 and the gate electrode 18.

Hereafter, the operation of the bidirectional switch of this embodiment will be described. For example, when the potential of the second ohmic electrode 17 is +100 V with respect to the potential of the first ohmic electrode 16, the first switch 21A is turned ON and the second switch 21B is turned OFF. Accordingly, a voltage is applied between the first ohmic electrode 16 and the gate electrode 18 by the first power supply 22A. Thus, a current flows from the second ohmic electrode 17 to the first ohmic electrode 16 when an output voltage of the first power supply 22A is higher than the threshold voltage of the FET 10, for example, a voltage of +1 V, and a current flowing from the second ohmic electrode 17 to the first ohmic electrode 16 can be cut off when the output voltage is lower than the threshold voltage, for example, a voltage of −5 V.

On the other hand, when the potential of the second ohmic electrode 17 is −100 V with respect to the potential of the first ohmic electrode 16, the first switch 21A is turned OFF and the second switch 21B is turned ON. Accordingly, a voltage is applied between the second ohmic electrode 17 and the gate electrode 18 by the second power supply 22B. Thus, a current flows from the first ohmic electrode 16 to the second ohmic electrode 17 when an output voltage of the second power supply 22B is higher than the threshold voltage of the FET 10, for example, a voltage of +1 V, and a current flowing from the first ohmic electrode 16 to the second ohmic electrode 17 can be cut off when the output voltage is lower than the threshold voltage, for example, a voltage of −5 V.

As has been described, the bidirectional switch of this embodiment can control between the conduction state in which a bidirectional current flows between the first ohmic electrode 16 and the second ohmic electrode 17 and the cut-off state in which a current does not flow therebetween. That is, a bidirectional switch can be realized by using a single FET.

Each of the first switch 21A and the second switch 21B may be any switch capable of performing a switching operation according to respective potentials of the first ohmic electrode 16 and the second ohmic electrode 17 and may be a mechanical switch or an electrical switch.

Moreover, the control circuit 20 may be configured so that the first power supply 22A outputs a higher voltage than the threshold voltage of the FET 10 and the second power supply 22B outputs a voltage lower than the threshold voltage of the FET 10. In that case, it is possible to operate the bidirectional switch as a diode which makes a current flow from the second ohmic electrode 17 to the first ohmic electrode 16 and cuts off a current flowing from the first ohmic electrode 16 to the second ohmic electrode 17. In the same manner, if the control circuit 20 is configured so that the first power supply 22A outputs a voltage lower than the threshold of the FET 10 and the second power supply 22B outputs a higher voltage than the threshold voltage of the FET 10, the operation of conducting a current flowing from the first ohmic electrode 16 to the second ohmic electrode 17 and cutting off a current flowing from the second ohmic electrode 17 to the first ohmic electrode 16 can be performed.

Figure 2:
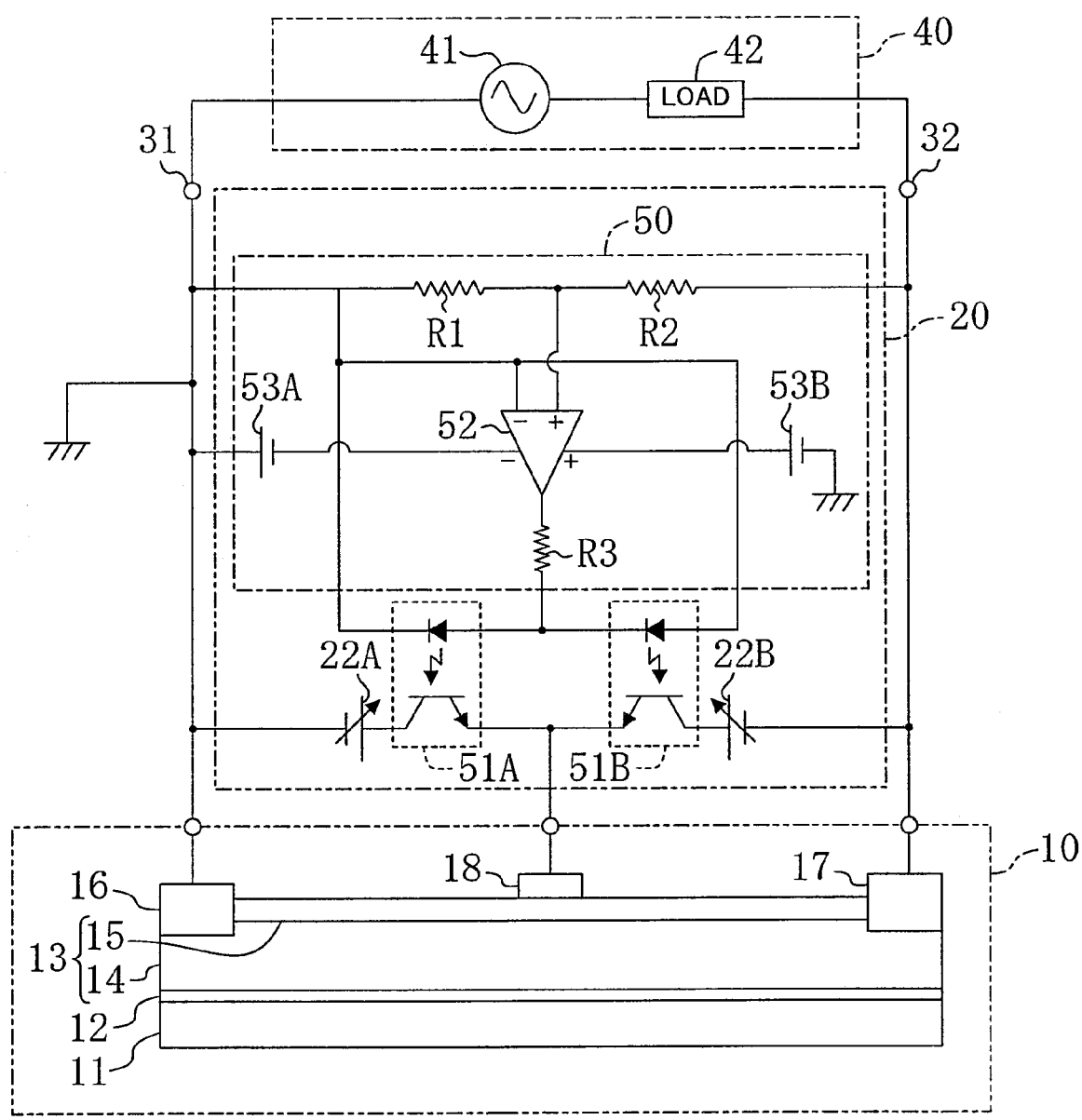
FIG. 2 is a diagram illustrating an exemplary configuration of a bidirectional switch according to the first embodiment of the present invention.
Figure 3:
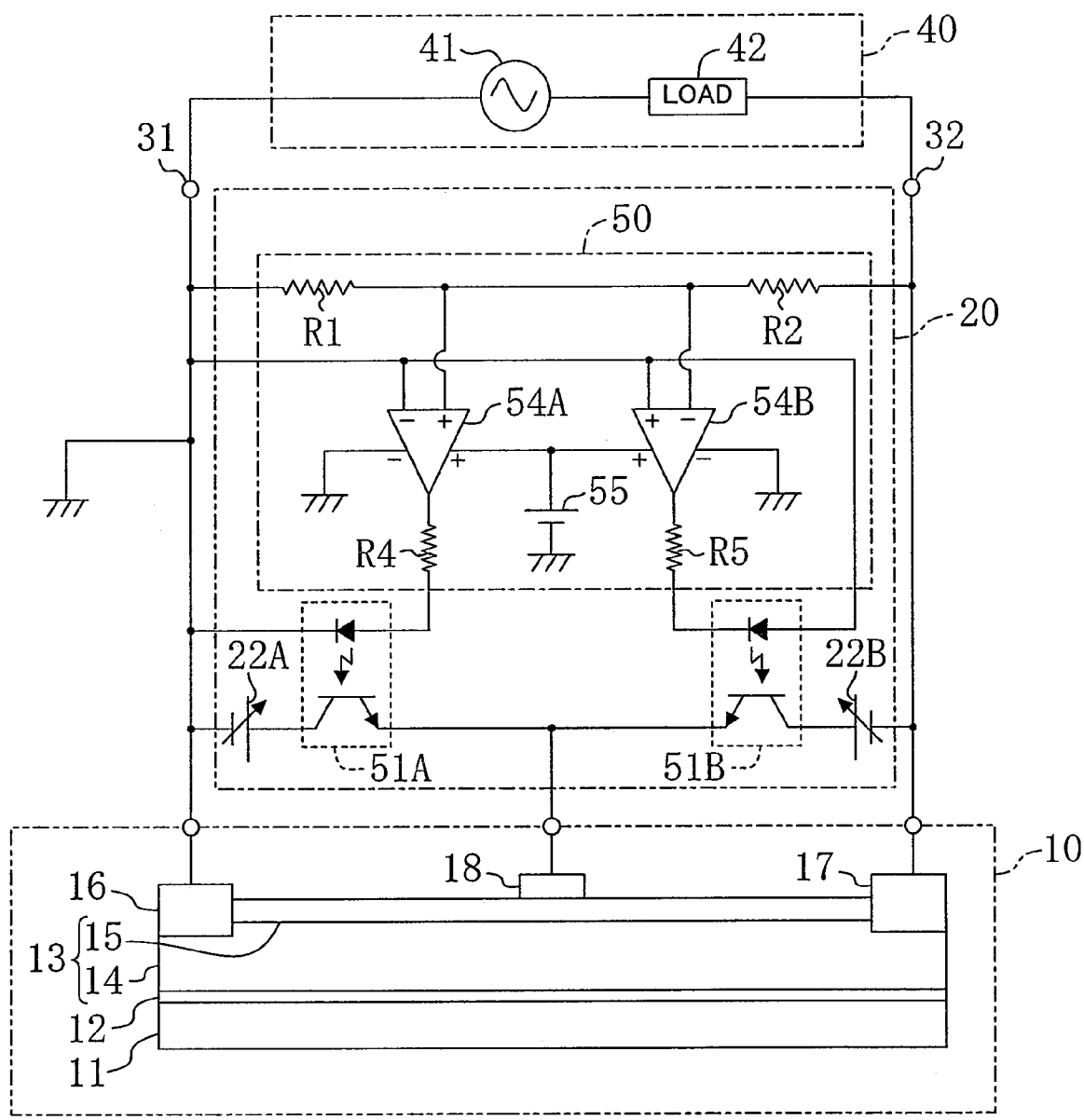
FIG. 3 is a diagram illustrating another exemplary configuration of a bidirectional switch according to the first embodiment of the present invention.

In FIG. 2 and FIG. 3, specific examples of the control circuit 20 are shown. In the control circuit 20 of FIG. 2, as each of the first switch 21A and the second switch 21B, a photocoupler is used and each of a first photocoupler 51A as the first switch 21A and a second photocoupler 51B as the second switch 21B is driven by a driving circuit 50.

The driving circuit 50 includes a differential amplifier (operational amplifier) 52 to which both positive and negative voltages are supplied by a power supply 53A and a power supply 53B. An output of the operational amplifier 52 is connected to an anode terminal of a light emitting diode (LED) of the first photocoupler 51A and a cathode terminal of a LED of the second photocoupler 51B via a third resistance element R3. The cathode terminal of the LED of the first photocoupler 51A and the anode terminal of the LED of the second photocoupler 51B are connected to the first ohmic electrode 16. A voltage resulting from voltage dividing by a first resistance element R1 and a second resistance element R2 is applied to a non-inverting input terminal of the operational amplifier 52. An inverting input terminal of the operational amplifier 52 is connected to the first ohmic electrode 16 and has a ground potential.

With the above-described structure, when the potential of the second ohmic electrode 17 is higher than the potential of the first ohmic electrode 16, a positive voltage resulting from voltage dividing by the first resistance element R1 and the second resistance element R2 is received by the non-inverting input terminal of the operational amplifier 52. The operational amplifier 52 compares a potential of the non-inverting input terminal and a potential of the inverting input terminal and outputs a voltage obtained by multiplying a voltage obtained by subtracting the potential of the inverting input terminal from the potential of the non-inverting input terminal by an amplification factor. When the potential of the second ohmic electrode 17 is higher than the potential of the first ohmic electrode 16, the potential of the non-inverting input terminal is positive and the potential of the inverting input terminal is 0 V. Accordingly, a voltage obtained by subtracting the potential of the inverting input terminal from the potential of the non-inverting input terminal is positive. Therefore, the operational amplifier 52 outputs a positive voltage. Accordingly, a current flows in the LED of the first photocoupler 51A and thus the first photocoupler 51A is turned ON. On the other hand, a current does not flow in the LED of the second photocoupler 51B and the second photocoupler 51B is turned OFF. Thus, a voltage is applied between the first ohmic electrode 16 and the gate electrode 18 by the first power supply 22A and a current flowing from the second ohmic electrode to the first ohmic electrode can be controlled by the first power supply 22A.

When the potential of the second ohmic electrode 17 is lower than the potential of the first ohmic electrode 16, a negative voltage resulting from voltage dividing by the first resistance element R1 and the second resistance element R2 is received by the operational amplifier 52 and thus the operational amplifier 52 outputs a negative voltage. Accordingly, the first photocoupler 51A is turned OFF and the second photocoupler 51B is turned ON. Thus, a voltage is applied between the second ohmic electrode 17 and the gate electrode 18 by the second power supply 22B and a current flowing from the first ohmic electrode 16 to the second ohmic electrode 17 can be controlled by the second power supply 22B.

Respective resistance values of the first resistance element R1 and the second resistance element R2 may be set so that after voltage dividing by the first resistance element R1 and the second resistance element R2, a maximum voltage to be received by the operational amplifier 52 is equal to or lower than a maximum voltage at which the operational amplifier can be operated. For example, when a voltage between the first ohmic electrode 16 and the second ohmic electrode 17 is 100 V, the resistance value of the first resistance element R1 may be set to be 50 kΩ and the resistance value of the second resistance element R2 may be set to be 950 kΩ. If a voltage of a load power supply is lower than a maximum voltage at which the operational amplifier can be operated, a non-inverting input terminal of the operational amplifier may be connected to the second ohmic electrode without providing the first resistance element R1 and the second resistance element R2. Moreover, the third resistance element R3 is a protective resistance of a LED of a photocoupler. For example, if an output of the operational amplifier 52 is 5 V and a forward direction voltage and a current in the LED are 1.6 V and 10 mA, respectively, the third resistance element R3 may be set to be 340 Ω.

The control circuit 20 may be formed so as to have a configuration of FIG. 3. As shown in FIG. 3, the driving circuit 50 includes a first operational amplifier 54A and a second operational amplifier 54B to which a positive voltage is supplied by a power supply 55. A voltage resulting from dividing of a voltage between the first ohmic electrode 16 and the second ohmic electrode 17 by the first resistance element R1 and the second resistance element R2 is applied to each of a non-inverting input terminal of the first operational amplifier 54A and an inverting input terminal of the second operational amplifier 54B. An inverting input terminal of the first operational amplifier 54A and a non-inverting input terminal of the second operational amplifier 54B are connected to the first ohmic electrode 16 and the terminals and the first ohmic electrode 16 are grounded. An output terminal of the first operational amplifier 54A is connected to the anode terminal of the LED of the first photocoupler 51A via a fourth resistance element R4 and an output terminal of the second operational amplifier 54B is connected to the cathode terminal of the LED of the second photocoupler 51B via a fifth resistance element R5. The cathode terminal of the LED of the first photocoupler 51A and the cathode terminal of the LED of the second photocoupler 51B are connected to the first ohmic electrode 16 and the terminals and the first ohmic electrode 16 are grounded.

For example, assume that the resistance value of the first resistance element R1 is 50 kΩ and the resistance value of the second resistance element R2 is 950 kΩ. When the potential of the second ohmic electrode 17 is +100 V with respect to the potential of the first ohmic electrode 16, as a result of voltage dividing by the first resistance element R1 and the second resistance element R2, a differential voltage of +5 V is received by the first operational amplifier 54A and a differential voltage of −5 V is received by the second operational amplifier 54B. If the voltage of the power supply 55 is 10 V and an amplification factor of each operational amplifier is 1000, a circuit is saturated due to the high voltage amplification factor, 10 V is output at the output terminal of the first operational amplifier 54A and 0 V is output at the output terminal of the second operational amplifier 54B. Thus, the first photocoupler 51A is turned ON and the second photocoupler 51B is turned OFF.

When the potential of the second ohmic electrode 17 is −10 V with respect to the potential of the first ohmic electrode 16, a differential voltage of −5 V is received by the first operational amplifier 54A and a differential voltage of +5 V is received by the second operational amplifier 54B. Thus, the first photocoupler 51A is turned OFF and the second photocoupler 51B is turned ON.

In this case, if a voltage of a load power supply is lower than a maximum voltage at which each operational amplifier can be operated, a non-inverting input terminal of the first operational amplifier and an inverting input terminal of the second operational amplifier may be connected to the second ohmic electrode without providing the first resistance element R1 and the second resistance element R2. Moreover, a resistance value of each of the fourth resistance element R4 and the fifth resistance element R5 may be any value with which the LED of each photocoupler can be protected. For example, when an output of an operational amplifier is 10 V and a forward direction voltage and a current of a LED are 1.6 V and 10 mA, respectively, the value of each of the fourth resistance element R4 and the fifth resistance element R5 may be, for example, 840 Ω.

The first embodiment has been described referring to the case where the FET 10 is a normally-on FET of which a threshold voltage is a negative voltage. However, a normally-off FET of which a threshold voltage is a positive voltage may be used. For example, if a FET of which a threshold voltage is +1 V is used as a normally-off FET, an output voltage of each of a first power supply and a second power supply is preferably a higher voltage than the threshold voltage, for example, a voltage of +5 V to make a bidirectional switch be in a conduction state. To make the bidirectional switch be in cut-off state, the output voltage of each of the first power supply and the second power supply is preferably a voltage lower than the threshold voltage, for example, a voltage of 0 V.

Moreover, by setting one of the voltage of the first power supply 22A and the second power supply 22B to be higher than the threshold voltage and the other to be lower than the threshold voltage, a bidirectional switch capable of performing the diode operation in which a current can be flow only in one direction between the first ohmic electrode 16 and the second ohmic electrode 17 and a current flowing in the other direction is cut off can be achieved.

In the first embodiment, an example where a variable power supply is used as each of the first power supply and the second power supply for controlling the bidirectional switch has been described. However, instead of a variable power supply, a typical gate driving circuit may be used. As a power supply to be connected to a gate driving circuit connected to the second ohmic electrode side, an isolated direct current voltage converter (DC-DC converter) which is not grounded is preferably used. As a power supply which is not grounded, a photocoupler, a battery or the like which is capable of voltage output may be used.

First Modified Example of First Embodiment

Figure 4:
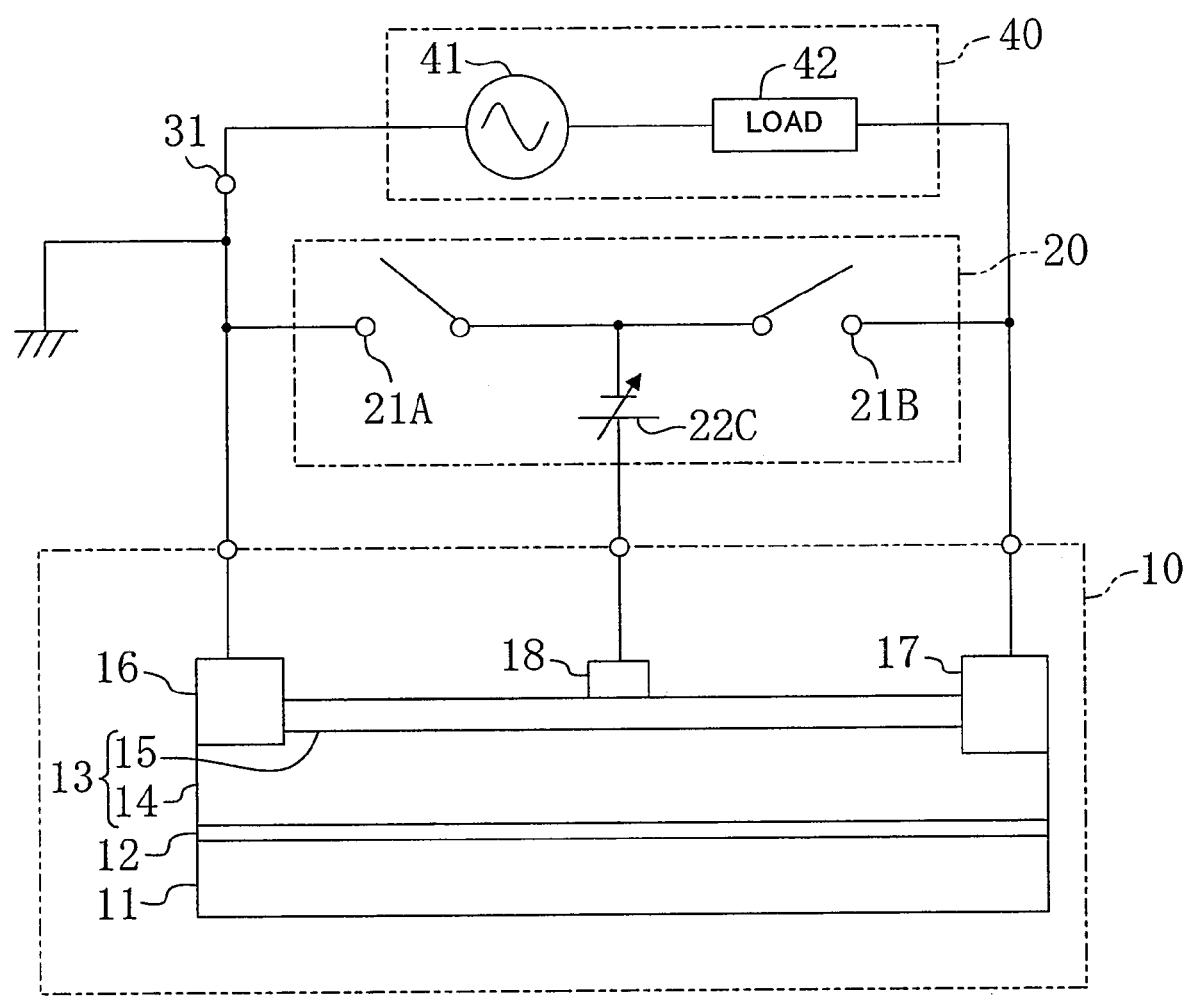
FIG. 4 is a diagram illustrating an exemplary configuration of a bidirectional switch according to a first modified example of the first embodiment of the present invention.

Hereafter, a first modified example of the first embodiment of the present invention will be described with reference to the accompanying drawings. FIG. 4 is a diagram illustrating a configuration of a bidirectional switch according to the first modified example of the first embodiment.

In the bidirectional switch of this modified embodiment, as shown in FIG. 4, a third power supply 22C connected to the gate electrode 18 is connected to a first ohmic electrode 16 via the first switch 21A and is connected to a second ohmic electrode 17 via the second switch 21B.

By driving the first switch 21A and the second switch 21B in the same manner as in the first embodiment, the bidirectional switch of this modified example performs the same operation as the operation of the bidirectional switch of the first embodiment. As for a driving circuit for driving each of the first switch 21A and the second switch 21B, the driving circuit described in the first embodiment can be used. The third power supply 22C is an insulating power supply and includes an insulating DC/DC converter, a battery and the like.

With the above-described configuration, a bidirectional current can be controlled by a single power supply. Therefore, a circuit configuration is simplified and costs are reduced.

Second Modified Example of First Embodiment

Figure 5:
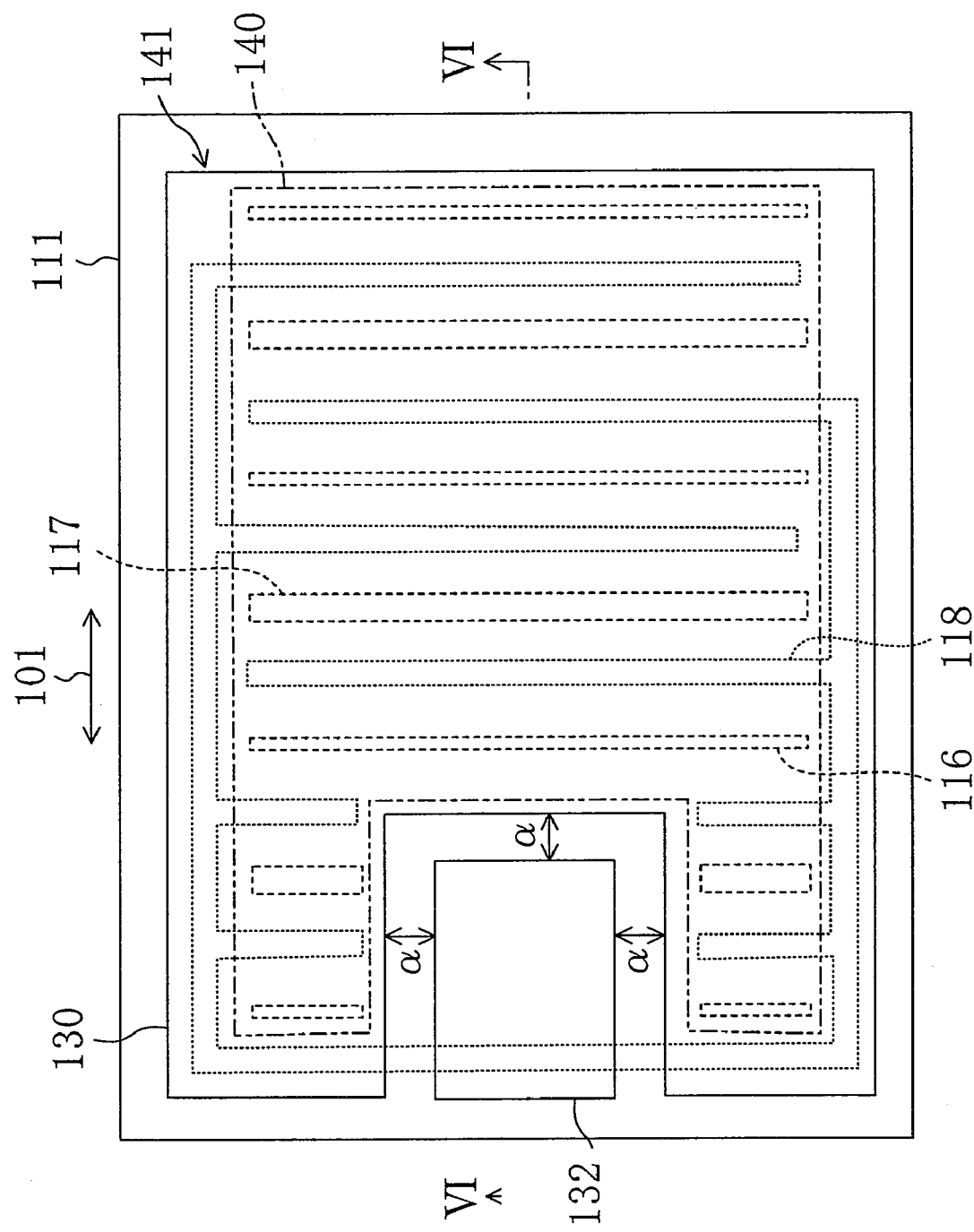
FIG. 5 is a planer view illustrating an exemplary configuration of a FET used for a bidirectional switch according to a second modified example of the first embodiment of the present invention.
Figure 6:
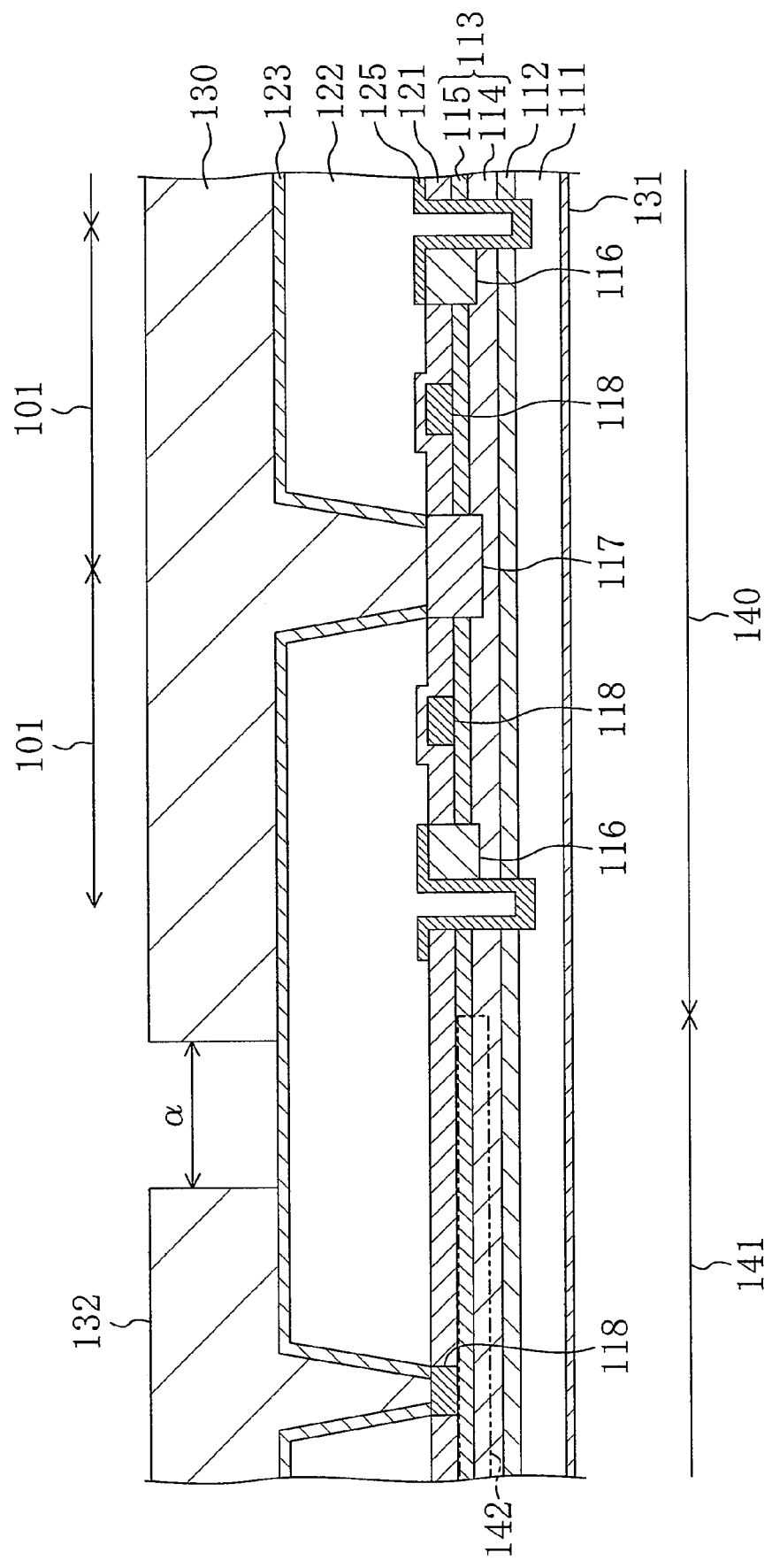
FIG. 6 is a cross-sectional view taken along the line VI-VI of FIG. 5 illustrating the FET used for the bidirectional switch of the second modified example of the first embodiment of the present invention.

Hereafter, a second modified example of the first embodiment of the present invention will be described with reference to the accompanying drawings. FIG. 5 and FIG. 6 illustrate a FET used as a bidirectional switch according to this modified example. FIG. 5 is a planer view illustrating the bidirectional switch viewed from the top and FIG. 6 is a cross-sectional view taken along the line VI-VI of FIG. 5.

As shown in FIG. 5 and FIG. 6, the FET of this modified example is a multifinger FET and a plurality of units 101 each including a first ohmic electrode 116, a gate electrode 118 and a second ohmic electrode 117 are arranged therein such that every second one of the units 101 is reversely placed with the second ohmic electrode 117 located in the center of any two of the units 101. Each first ohmic electrode 116 is electrically connected to a first ohmic electrode pad 131 formed on a surface (i.e., back surface) of a substrate 111 at the other side than an upper surface side on which a semiconductor layer 113 is formed. Each second ohmic electrode 117 is electrically connected to a second ohmic pad 130 formed on the upper surface side of the substrate 111. Each gate electrode 118 is electrically connected to a gate electrode pad 132 formed on the upper surface side of the substrate 111. Thus, a gate width of the FET can be made very large and the FET capable of a large current operation can be achieved.

Specifically, a buffer layer 112 in which aluminum nitride (AlN) having a thickness of 10 nm and gallium nitride (GaN) having a thickness of 10 nm are alternately stacked and which has a thickness of 1 μm is formed on the substrate 111 of silicon having a principal surface with a (111) plane direction. On the buffer layer 112, the semiconductor layer 113 in which an undoped GaN layer 114 having a thickness of 2 μm and a AlGaN layer 115 which has a thickness of 20 nm and in which Si is doped are stacked is formed. A two-dimensional electron gas (2DEG) layer is generated at an interface of the GaN layer 114 with the AlGaN layer 115.

In part of the semiconductor layer 113 other than an active region 140, impurity ions of boron or the like are implanted. Thus, part of the semiconductor layer 113 selectively serves as an insulating film 142 and a high resistance region 141 is formed. On the active region 140, the first ohmic electrode 116, the second ohmic electrode 117 and the gate electrode 118 are provided so as to be spaced apart from one another. Giving a close look at arbitrary two of the units 101, two of the units 101 share a single second ohmic electrode 117. First ohmic electrodes 116 are formed at both sides of the shared second ohmic electrode 117, respectively, and a gate electrode 118 is formed in a midway between the second ohmic electrode 117 and an associated one of the first ohmic electrode 116. With this arrangement, a distance between the second ohmic electrode 117 and the gate electrode 118 is equalized with a distance between the first ohmic electrode 116 and the gate electrode 118, so that a breakdown voltage between the gate electrode 118 and the second ohmic electrode 117 and a breakdown voltage between the first ohmic electrode 116 and the gate electrode 118 can be equalized with each other at a high breakdown voltage. In the FET of this modified example, each of the distance between the second ohmic electrode 117 and the gate electrode 118 and the distance of the first ohmic electrode 116 and the gate electrode 118 is 10 µm.

To reduce a contact resistance with the 2DEG layer, each of the first ohmic electrode 116 and the second ohmic electrode 117 is formed in part of the semiconductor layer 113 from which the AlGaN layer 115 has been removed and which extends to a depth of about 40 nm from a top surface of the GaN layer 114. Each first ohmic electrode 116 is electrically connected to the conductive substrate 111 by an inter-electrode interconnect 125. The inter-electrode interconnect 125 is formed in a contact hole formed by selectively removing parts of the semiconductor layer 113, the buffer layer 112 and the substrate 111. On the back surface of the substrate 111, the first ohmic electrode pad 131 is formed. The first ohmic electrode pad 131 is formed of, for example, gold (Au) and tin (Sn) and forms an ohmic contact with the conductive substrate 111 and also is electrically connected with the conductive substrate 111. Accordingly, the first ohmic electrode 116 is electrically connected to the first ohmic electrode pad 131 via the inter-electrode interconnect 125 and the substrate 111.

On the semiconductor layer 113, a protective film 121 of SiN, a first insulating film 122 and a second insulating film 123 are formed in this order. The first insulating film 122 has a flattened upper surface. In the first insulating film 122, an opening portion is formed so that it has a tapered shape and the second ohmic electrode 117 is exposed therethrough. The second insulating film 123 is formed so as to cover an upper surface of the first insulating film 122 and side surfaces of the opening portion. The first insulating film 122 may be, for example, a film made of $SiO_2$ containing phosphorus and having a thickness of 6 µm. As the first insulating film 122, a polyimide film, a benzo-cyclo-butene (BCB) film or the like may be used. By using a $SiO_2$ film containing phosphorus as the first insulating film 122, film stress of the first insulating film 122 is relaxed and the occurrence of film peeling can be prevented. Moreover, due to the gettering effect of phosphorus, the effect of preventing invasion of an alkali impurity into the semiconductor layer 113 forming a transistor can be achieved, so that reliability of the transistor can be improved. As the second insulating film 123, SiN having a thickness of 0.2 µm may be used.

Breakdown electric field of each of a silicon oxide film containing phosphorus, polyimide film and a BCB film formed by chemical vapor deposition (CVD) is about 3 MV/cm. However, considering a concave and convex shape of a nitride semiconductor device and variations in film characteristics, the nitride semiconductor device has to be designed on the assumption that breakdown electric field is about 1 MV/cm. Accordingly, to realize a nitride semiconductor device of which a breakdown voltage is 200 V or more, a thickness of the first insulating film 122 is preferably 2 µm or more. To achieve further higher breakdown voltage, the thickness of the first insulating film 122 may be 5 µm or more. If the thickness of the first insulating film 122 is 10 µm or more, the breakdown voltage can be improved. If the thickness of the first insulating film 122 is too thick, too much side etching occurs in wet etching for forming an opening or like problem arises. Therefore, the thickness of the first insulating film 122 is preferably 25 µm or less and further preferably 20 µm or less.

On the second insulating film 123, the second ohmic pad 130 is formed. The second ohmic pad 130 fills the opening portion and is electrically connected to the second ohmic electrode 117 exposed through the opening portion. The second ohmic pad 130 may be formed of, for example, Al having a thickness of 4 µm.

Each gate electrode 118 extends so as to reach the high resistive region 141 surrounding the active region 140 and parts of the gate electrodes 118 located on the high resistive region 141 are connected to one another. The parts of the gate electrodes 118 located on the high resistive region 141 function as gate interconnects. A gate electrode pad 132 is formed with the first insulating film 122 and the second insulating film 123 interposed therebetween. Part of the gate electrode pad 132 is located in the first insulating film 122 so as to fill an opening portion through which the gate electrode 118 is exposed. The gate electrode pad 132 and the gate electrode 118 are electrically connected.

Moreover, the gate electrode pad 132 and the second ohmic pad 130 are formed so that a distance α therebetween is ensured. By keeping the distance α, the occurrence of air discharge between the gate electrode pad 132 and the second ohmic pad 130 can be prevented. In this embodiment, the distance α is 100 µm.

In the FET of this modified embodiment, the first ohmic electrode pad 131 is a rear electrode formed on the back surface of the substrate 111. Thus, the gate electrode 118 and the first ohmic electrode 116 do not intersect with each other. A sufficient distance can be provided between the first ohmic electrode pad 131 and the gate electrode 118. Specifically, in regions located outside of the active region 140, the semiconductor layer 113 has increased resistance. Thus, sufficient insulation can be given between the substrate 111 and the part of the gate electrode 118 functioning as the gate interconnect. Sufficient insulation is also given between the gate electrode 118 and the second ohmic pad 130 by the protective film 121, the first insulating film 122 and the second insulating film 123. Therefore, in the FET of this modified embodiment, the breakdown voltage between the gate electrode 118 and the first ohmic electrode 116 and the breakdown voltage between the gate electrode 118 and the second ohmic electrode 117 can be sufficiently ensured and a high breakdown voltage of a bidirectional switch can be realized by combination of the FET with a control circuit.

The same control circuit as the control circuit of the first embodiment or the first modified example may be used. The high resistive region 141 may be formed by a method in which another insulating film is selectively formed on the semiconductor layer 113, instead of the method in which ions such as boron ions may be selectively implanted into the semiconductor layer 113 to form the insulating film 142.

Figure 7:
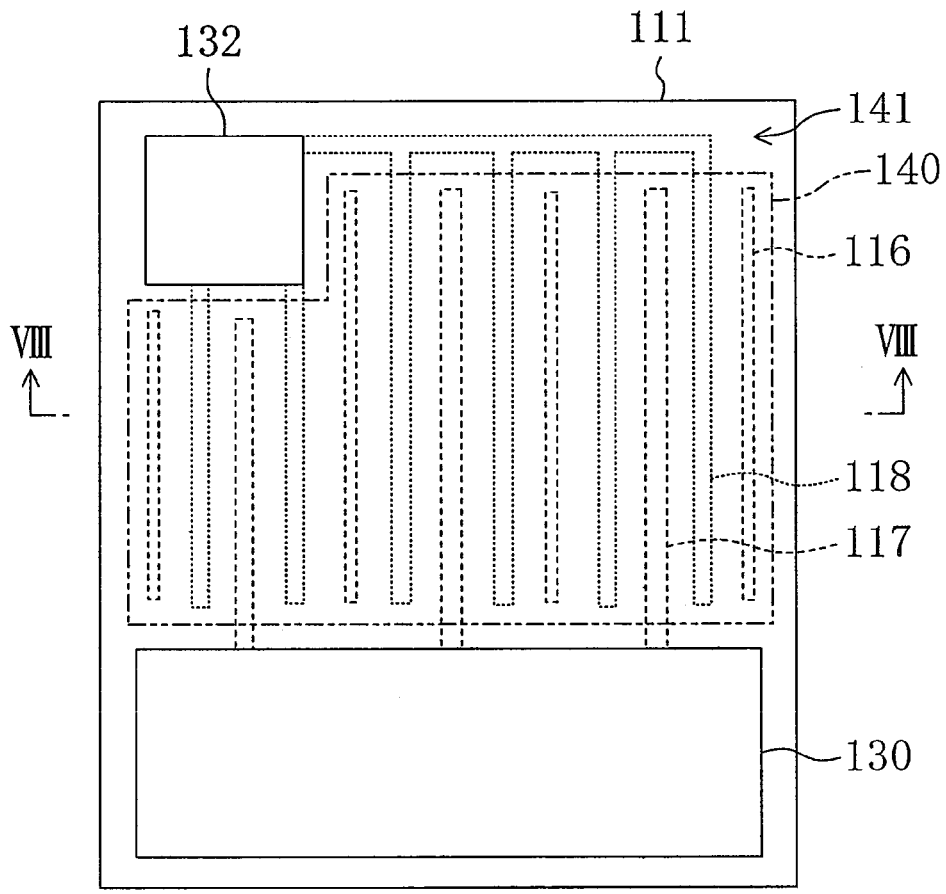
FIG. 7 is a planer view illustrating a modified example of the FET used for the bidirectional switch of the second modified example of the first embodiment of the present invention.
Figure 8:
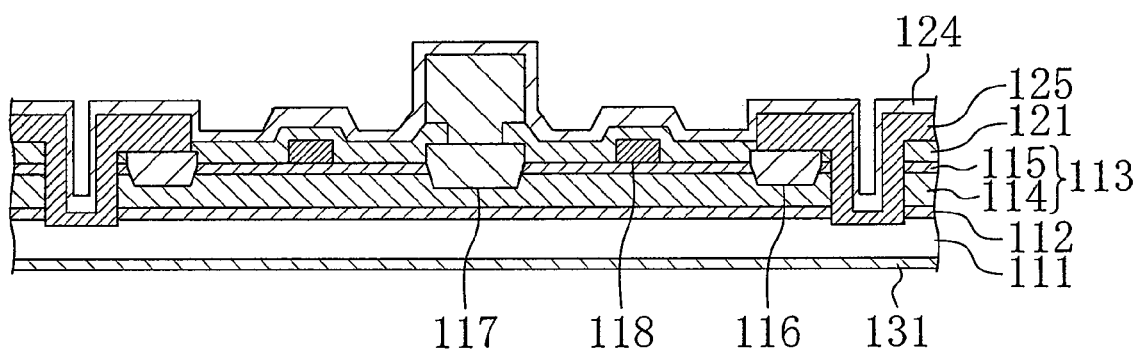
FIG. 8 is a cross-sectional view taken along the line VIII-VIII of FIG. 7 illustrating a modified example of the FET used for the bidirectional switch of the second modified example of the first embodiment of the present invention.

As shown in FIG. 7 and FIG. 8, the second ohmic pad 130 may be formed not on the active region 140 but on the high resistive region 141. With this structure, an insulating film 124 having a small thickness may be formed, instead of an insulting film having a large thickness between the second ohmic pad 130 and the gate electrode 118, so that the number of process steps can be reduced. By forming the second ohmic pad 130 on the high resistive region 141, impact on the active region 140 in wire bonding can be prevented. Thus, the effect of improving reliability of the FET can be advantageously achieved.

Figure 9:
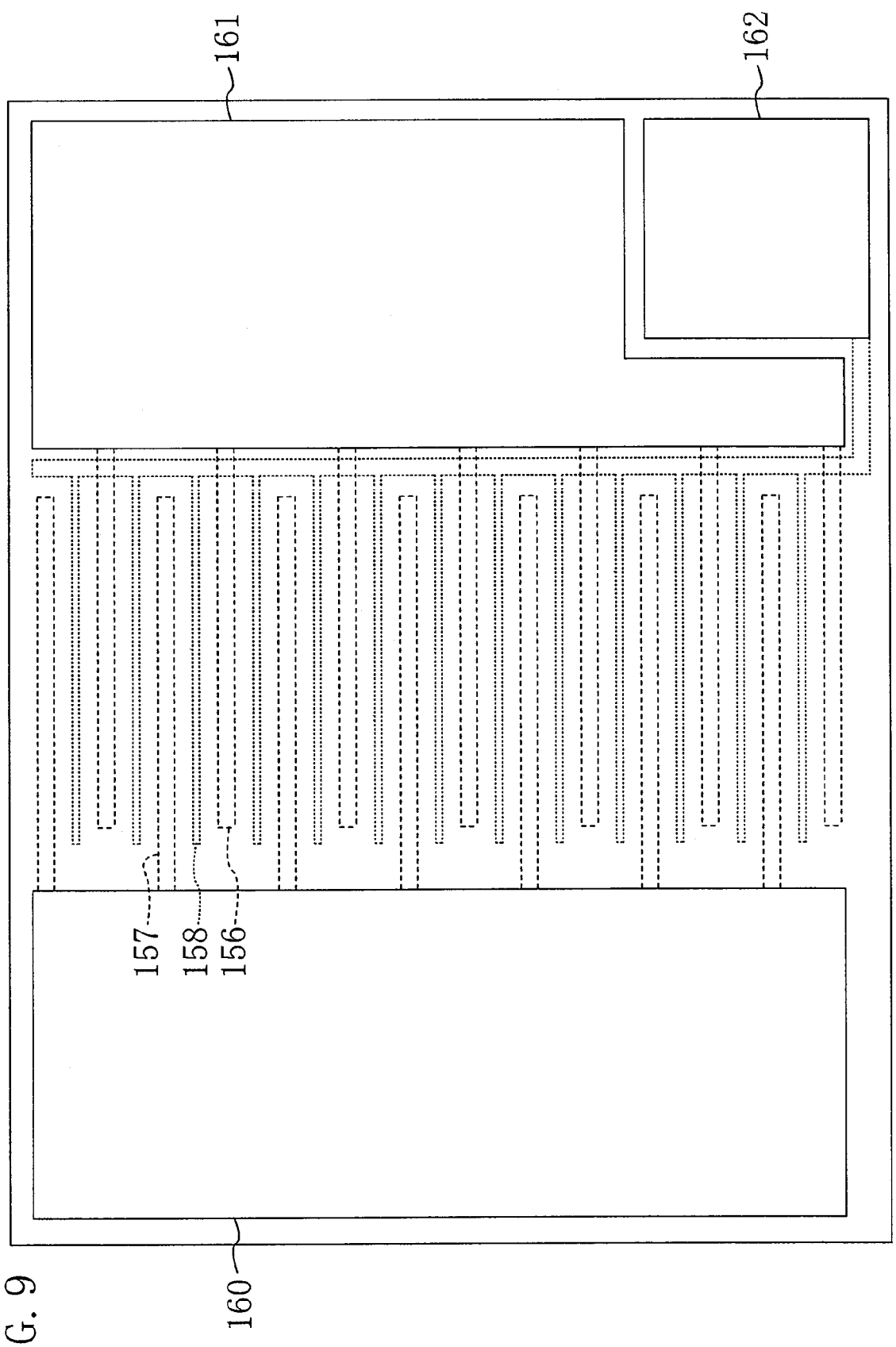
FIG. 9 is a planer view illustrating a modified example of the FET used for the bidirectional switch of the second modified example of the first embodiment.

A multifinger FET of FIG. 9 can be used. In such a case, a second ohmic electrode pad 160, a first ohmic electrode pad 161 and a gate electrode pad 162 are formed on a surface of the substrate. Thus, a gate electrode 158 and a second ohmic electrode 157 do not intersect each other but the gate electrode 158 and a first ohmic electrode 156 intersect with each other. Then, at a portion where the gate electrode 158 and the first ohmic electrode 156 intersect with each other, an insulating film (not shown) may be formed between the gate electrode 158 and the first ohmic electrode 156 so as to have a sufficient thickness. In this manner, if a breakdown voltage between the gate electrode 158 and the first ohmic electrode 156 is ensured while making a breakdown voltage of the insulating film equal to or larger than a breakdown voltage between the gate electrode 158 and the first ohmic electrode 156, the FET of FIG. 9 can be used as a bidirectional switch. In this case, as the insulating film between the gate electrode 158 and the first ohmic electrode 156, polyimide, silicon oxide containing phosphorus, BCB or the like is preferably used. The insulating film may be a lamination film.

Second Embodiment

Figure 10:
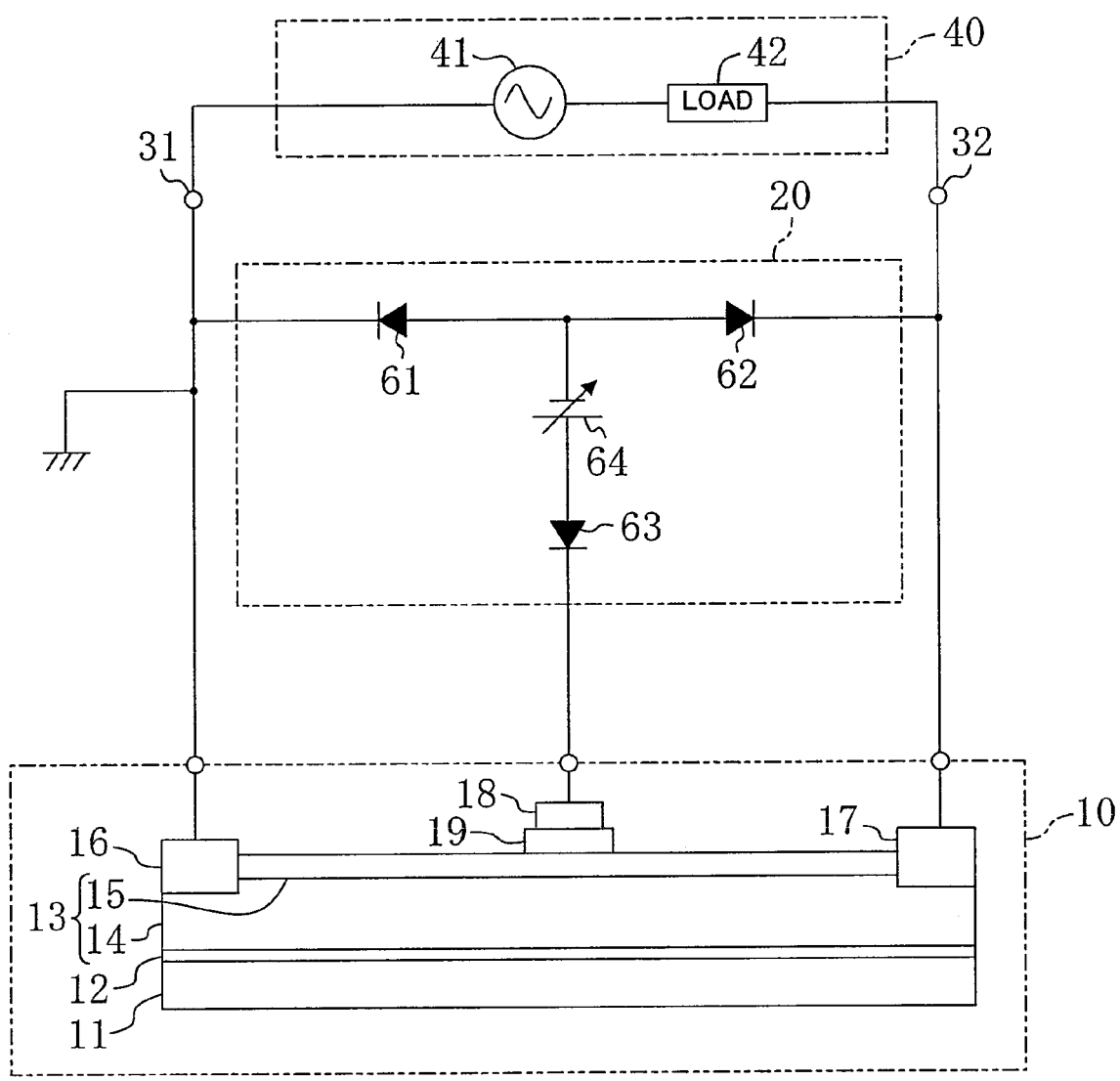
FIG. 10 is a circuit diagram illustrating a bidirectional switch according to a second embodiment of the present invention.

Hereafter, a second embodiment of the present invention will be described with reference to the accompanying drawings. FIG. 10 is a diagram illustrating a circuit configuration of a bidirectional switch according to the second embodiment. In FIG. 10, each member also shown in FIG. 1 is identified by the same reference numeral and therefore the description thereof will be omitted.

The bidirectional switch of this embodiment uses a normally-off FET as a FET 10. The normally-off FET may be a FET obtained by forming, in the FET 10 described in the first embodiment, a gate electrode 18 of Pd and Au on part of a semiconductor layer 13 located between a first ohmic electrode 16 and a second ohmic electrode 17 with a p-type semiconductor layer 19 of p-type GaN to which magnesium (Mg) is doped and which has a thickness of 300 nm interposed therebetween. The normally-off FET may be a multifinger FET such as the multifinger FET of the second modified example of the first embodiment.

With the above-described configuration, a PN junction is formed between the p-type semiconductor layer 19 and an n-type AlGaN layer 15. Thus, even when a gate voltage is 0 V, a depletion layer expands from the p-type semiconductor layer 19 to the n-type AlGaN layer 15 and a GaN layer 14 and a current flowing in a 2DEG layer is cut off, so that a normally-off FET is achieved. In the above-described case, a FET of which a threshold voltage is about +1 V is achieved.

To ensure a bidirectional breakdown voltage, i.e., a breakdown voltage between the first ohmic electrode 16 and the gate electrode 18 and a breakdown voltage between the second ohmic electrode 17 and the gate electrode 18, a distance between the first ohmic electrode 16 and the p-type semiconductor layer 19 is preferably equalized with a distance between the second ohmic electrode 17 and the p-type semiconductor layer 19. For example, in the case of a bidirectional switch for switching at 100 V, each of the distance between the first ohmic electrode 16 and the p-type semiconductor layer 19 and the distance between the second ohmic electrode 17 and the p-type semiconductor layer 19 may be 10 μm. To obtain the bidirectional breakdown voltage, it is preferable that the distance between the first ohmic electrode 16 and the p-type semiconductor layer 19 is equalized to the distance between the second ohmic electrode 17 and the p-type semiconductor layer 19. However, as long as the bidirectional breakdown voltage is ensured, the distances do not have to be equal to each other and may be set to be a distance with which a necessary breakdown voltage is ensured or a larger distance.

The control circuit 20 includes a first diode 61 and a second diode 62 connected between the first ohmic electrode 16 and the second ohmic electrode 17. A cathode terminal of the first diode 61 is connected to the first ohmic electrode 16 and an anode terminal of the first diode 61 is connected to an anode terminal of the second diode 62. A cathode terminal of the second diode 62 is connected to the second ohmic electrode 17.

Between a connection node at which the anode terminal of the first diode 61 and the anode terminal of the second diode 62 are connected and the gate electrode 18, a variable power supply 64 and a third diode 63 are connected so that the variable power supply 64 and the third diode 63 themselves are connected to each other in series. The variable power supply 64 is a power supply for applying a gate bias, which is a non-grounded insulating power supply. As for the variable power supply 64 and the third diode 63, a cathode terminal of the third diode 63 and the gate electrode 18 are connected to each other and an anode terminal of the third diode 63 and a positive terminal of the variable power supply 64 are connected to each other, a negative terminal of the variable power supply 64 and the connection node are connected to each other. The arrangement order of the third diode 63 and the variable power supply 64 may be reversed, the positive terminal of the variable power supply 64 may be connected to the gate electrode 18, the negative terminal of the variable power supply 64 may be connected to the cathode terminal of the third diode 63 and the anode terminal of the third diode 63 may be connected to the connection node.

Hereafter, the operation of the bidirectional switch of the second embodiment will be described. First, when the bidirectional switch is intended to be in a cut-off state in which a current does not flow between a first terminal 31 and a second terminal 32, an output of the variable power supply 64 is a voltage lower than a threshold voltage, for example, a voltage of 0 V.

In this state, for example, assume that a potential of the second terminal 32 is higher than a potential of the first terminal 31. Then, for example, if the potential of the second terminal 32 is +100 V with respect to the potential of the first terminal 31, a voltage between the first ohmic electrode 16 and the second ohmic electrode 17 is mostly applied to the second diode 62 and a voltage corresponding to a turn-on voltage VF of each diode is applied to the first diode 61. A voltage of the connection node is applied to the gate electrode 18 via the variable power supply 64 and the third diode 63. That is, a potential resulting from voltage drop by VF of the third diode 63 is given to the gate electrode 18. As a result, the same voltage as the voltage applied to the variable power supply 64 is applied to the gate electrode 18. If the threshold voltage of the FET 10 is +1 V, a voltage lower than the threshold voltage is applied between the gate electrode 18 and the first ohmic electrode 16, so that a current flowing from the second ohmic electrode 17 to the first ohmic electrode 16 can be cut off.

In contrast, assume that the potential of the second terminal 32 is lower than the potential of the first terminal 31. Then, for example, if the potential of the second terminal 32 is −100 V with respect to the potential of the first terminal 31, a voltage between the first ohmic electrode 16 and the second ohmic electrode 17 is mostly applied to the first diode 61. Accordingly, a potential equal to the potential of the second ohmic electrode 17 is given to the gate electrode 18 via the variable power supply 64 and the third diode 63. Thus, an output voltage of the variable power supply 64 is applied between the gate electrode 18 and the second ohmic electrode 17 and the output voltage of the variable power supply 64 is lower than the threshold voltage, so that a current flowing from the first ohmic electrode 16 to the second ohmic electrode 17 can be cut off.

Next, when the bidirectional switch is intended to be in a conduction state in which a bidirectional current flows between the first terminal 31 and the second terminal 32, an output of the variable power supply 64 is a higher voltage than the threshold voltage, for example, a voltage of +5 V.

In this state, for example, assume that the potential of the second terminal 32 is higher than the potential of the first terminal 31. For example, if the potential of the second terminal 32 is +100 V with respect to the potential of the first terminal 31, a voltage between the first ohmic electrode 16 and the second ohmic electrode 17 is mostly applied to the second diode 62 and a voltage corresponding to the turn-on voltage VF of the diode is applied to the first diode 61. A potential of the connection node is applied to the gate electrode 18 via the variable power supply 64 and the third diode 63. That is, a potential resulting from voltage drop by VF of the third diode 63 is given to the gate electrode 18. As a result, the same voltage as the voltage applied to the variable power supply 64 is applied to the gate electrode 18. If the threshold voltage of the FET 10 is +1 V, a higher voltage than the threshold voltage is applied between the gate electrode 18 and the first ohmic electrode 16, so that a current can be made to flow from the second ohmic electrode 17 to the first ohmic electrode 16.

In contrast, assume that the potential of the second terminal 32 is lower than the potential of the first terminal 31. For example, if the potential of the second terminal 32 is −100 V with respect to the potential of the first terminal 31, a voltage between the first ohmic electrode 16 and the second ohmic electrode 17 is mostly applied to the first diode 61. Accordingly, for the gate electrode 18, an output voltage of the variable power supply 64 is given between the second ohmic electrode 17 and the gate electrode 18 via the variable power supply 64 and the third diode 63. Since the output voltage of the variable power supply 64 is higher than the threshold voltage, a current can be made to flow from the first ohmic electrode 16 to the second ohmic electrode 17.

In this embodiment, the bidirectional switch using a normally-off FET has been described. However, the normally-on FET described in the first embodiment may be used. In such a case, when cutting off a bidirectional current, in order to apply a voltage equal to or lower than the threshold voltage from the variable power supply 64, a negative voltage, for example, of −3 V is output. Moreover, in making bidirectional current conductive, a higher voltage than the threshold voltage may be applied from the variable power supply 64. Thus, for example, a voltage of 0 V is output.

In this embodiment, the variable power supply 64 is connected to the gate electrode 18 via the third diode 63. However, as long as a bidirectional current can be controlled, the variable power supply 64 may be directly connected to the gate electrode 18.

In the second embodiment, the example where a variable power supply is used as a power supply for controlling a bidirectional switch has been described. However, instead of the variable power supply, a typical gate driving circuit may be used. As a power supply to be connected to this gate driving circuit, a non-grounded insulating direct current voltage converter (DC-DC converter) is preferably used. Moreover, as a non-grounded power supply, a photovoltaic device such as a solar battery, a battery or the like which is capable of voltage output may be used.

Third Embodiment

Figure 11:
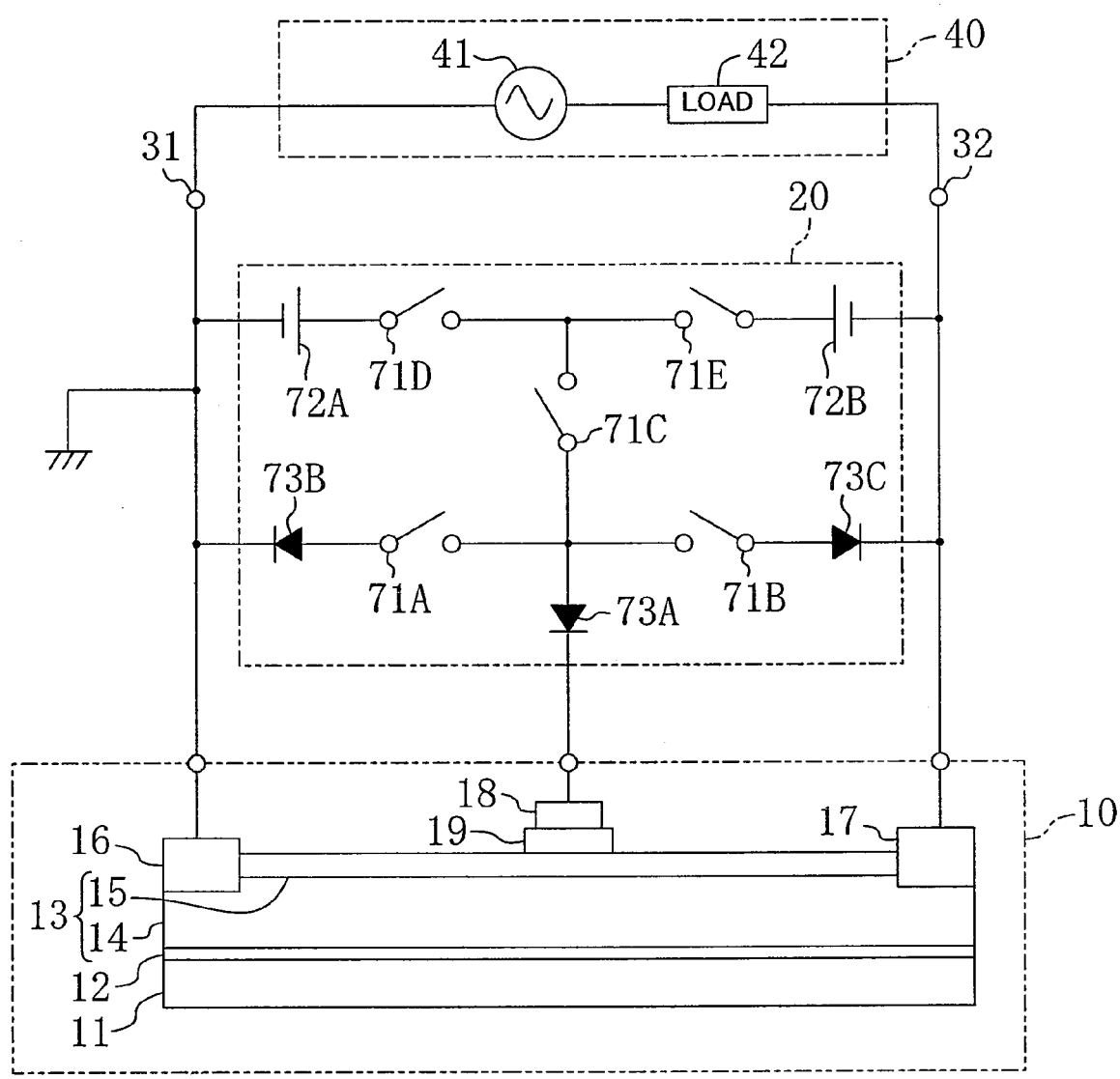
FIG. 11 is a circuit diagram illustrating a bidirectional switch according to a third embodiment of the present invention.

Hereafter, a third embodiment of the present invention will be described with reference to the accompanying drawings. FIG. 11 is a diagram illustrating a circuit configuration of a bidirectional switch according to the third embodiment. In FIG. 11, each member also shown in FIG. 1 is identified by the same reference numeral and therefore the description thereof will be omitted.

The bidirectional switch of this embodiment uses a normally-off FET as a FET 10. The normally-off FET is not specifically limited but, for example, the normally-off FET of the second embodiment may be used. A multifinger FET may be also used.

A control circuit 20 includes a first diode 73A to which a cathode terminal of a gate electrode 18 is connected. A second diode 73B is connected between an anode terminal of the first diode 73A and a first ohmic electrode 16 via a first switch 71A. The second diode 73B has an anode terminal connected to the first switch 71A and a cathode terminal connected first ohmic electrode 16. A third diode 73C is connected between the anode terminal of the first diode 73A and a second ohmic electrode 17 via a second switch 71B. The third diode 73C has an anode terminal connected to the second switch 71B and a cathode terminal connected to the second ohmic electrode 17.

The anode terminal of the first diode 73A is connected to one terminal of a third switch 71C and a first power supply 72A is connected between the other terminal of the third switch 71C and the first ohmic electrode 16 via a fourth switch 71D. A second power supply 72B is connected between said other terminal of the third switch 71C and the second ohmic electrode 17 via a fifth switch 71E. An output voltage of each of the first power supply 72A and the second power supply 72B is a higher voltage than a threshold voltage of the FET 10 and may be, for example, a voltage of 5 V.

Hereafter, the operation of the bidirectional switch of the third embodiment will be described. First, when the bidirectional switch is intended to be in a cut-off state in which a bidirectional current does not flow between a first terminal 31 and a second terminal 32, the third switch 71C is turned OFF and the first switch 71A and the second switch 71B are turned ON. The fourth switch 71D performs the same operation as the operation of the first switch of the first embodiment and the fifth switch 71E performs the same operation as the operation of the second switch of the first embodiment.

In this state, for example, assume that a potential of the second terminal 32 is higher than a potential of the first terminal 31. For example, if the potential of the second terminal 32 is +100 V with respect to the potential of the first terminal 31, a voltage between the first ohmic electrode 16 and the second ohmic electrode 17 is mostly applied to the third diode 73C and a voltage corresponding to the turn-on voltage VF of each diode is applied to the second diode 73B. A potential between the first switch 71A and the second switch 71B is applied to the gate electrode 18 via the first diode 73A. That is, a potential resulting voltage drop by VF of the first diode 73A is given to the gate electrode 18. As a result, an equal voltage to the potential of the first ohmic electrode 16 is applied to the gate electrode 18. Assuming that the threshold voltage of the FET 10 is +1 V, a lower voltage than the threshold voltage is applied between the gate electrode 18 and the first ohmic electrode 16, so that a current flowing from the second ohmic electrode 17 to the first ohmic electrode 16 can be cut off.

In contrast, assume that the potential of the second terminal 32 is lower than the potential of the first terminal 31. For example, if the potential of the second terminal 32 is −100 V with respect to the potential of the first terminal 31, a voltage between the first ohmic electrode 16 and the second ohmic electrode 17 is mostly applied to the second diode 73B. Accordingly, a potential equal to the potential of the second ohmic electrode 17 is given to the gate electrode 18 via the first diode. Thus, a voltage between the gate electrode 18 and the second ohmic electrode 17 becomes lower than the threshold voltage, so that a current flowing from the first ohmic electrode 16 to the second ohmic electrode 17 can be cut off.

Next, when the bidirectional switch is intended to be in a conduction state in which a bidirectional current flows between the first terminal 31 and the second terminal 32, the third switch 71C is turned ON and the first switch 71A and the second switch 71B are turned OFF. Furthermore, when a potential of the second terminal 32 is higher than the threshold voltage, for example, when the potential of the second terminal 32 is +100 V with respect to the potential of the first terminal 31, the fourth switch 71D is turned ON and the fifth switch 71E is turned OFF. In this case, by the first switch 71A, a higher voltage than the threshold voltage of the FET 10, i.e., a voltage of 5 V is applied between the first ohmic electrode 16 and the gate electrode 18, so that a current can be made to flow from the second ohmic electrode 17 to the first ohmic electrode 16.

On the other hand, assume that the potential of the second terminal 32 is lower than the potential of the first terminal 31. For example, if the potential of the second terminal 32 is −100 V with respect to the potential of the first terminal 31, the fourth switch 71D is turned OFF and the fifth switch 71E is turned ON. In this case, by the second power supply 72B, a higher voltage than the threshold voltage of the FET 10, i.e., a voltage of 5 V is applied between the second ohmic electrode 17 and the gate electrode 18, so that a current can be made to flow from the first ohmic electrode 16 to the second ohmic electrode 17. Moreover, as the bidirectional switch is turned from a cut-off state to a conduction state, a voltage of the second ohmic electrode 17 is reduced to an ON voltage and the bidirectional switch is turned ON.

Figure 12:
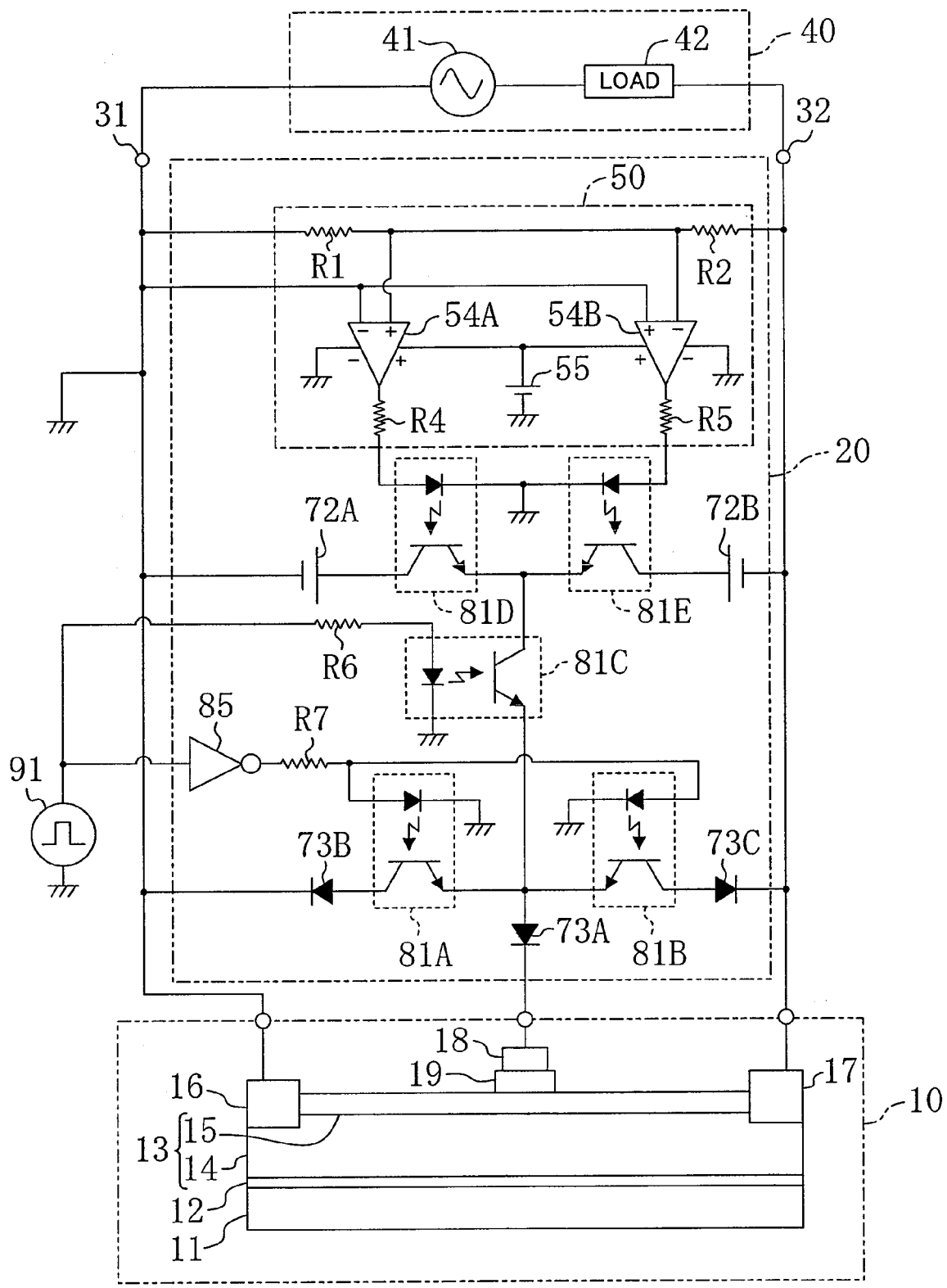
FIG. 12 is a circuit diagram illustrating an exemplary configuration of the bidirectional switch of the third embodiment of the present invention.
Figure 13:
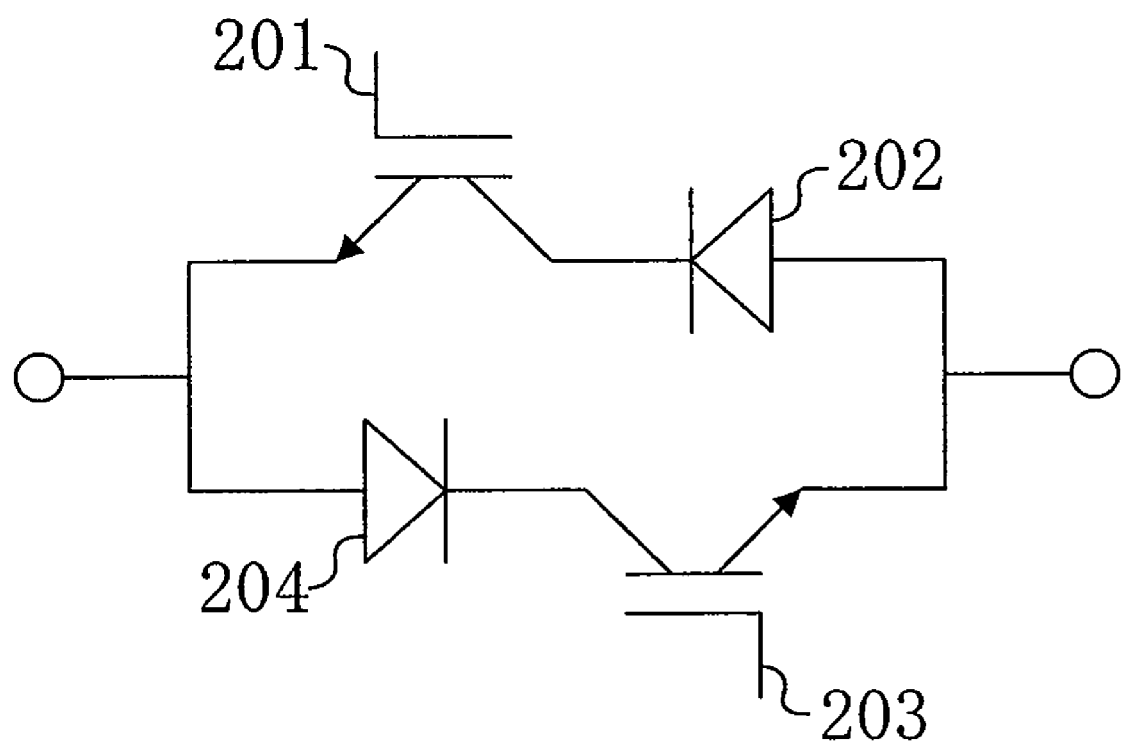
FIG. 13 is a circuit diagram illustrating a bidirectional switch according to a known example.

In FIG. 12, a specific example of the control circuit 20 is illustrated. The control circuit 20 of FIG. 12 uses, as the first switch 71A, the second switch 71B, the third switch 71C, the fourth switch 71D and the fifth switch 71E, a first photocoupler 81A, a second photocoupler 81B, a third photocoupler 81C, a fourth photocoupler 81D and a fifth photocoupler 81E, respectively.

The same driving circuit 50 illustrated in FIG. 3 is used to drive the fourth photocoupler 81D and the fifth photocoupler 81E, and therefore the description thereof will be omitted.

A LED of the third photocoupler 81C is connected to a gate driving signal source 91, and the first photocoupler 81A and the second photocoupler 81B are connected to the gate driving signal source 91 via an inverter 85. Thus, when the gate driving signal source 91 outputs a signal for making a photocoupler in an OFF state, for example a signal of 0 V, the third photocoupler 81C is turned OFF and the first photocoupler 81A and the second photocoupler 81B are turned ON. Accordingly, the bidirectional switch becomes in a cut-off state in which a current does not flow between the first terminal 31 and the second terminal 32.

When the gate driving signal source 91 outputs a voltage for making a photocoupler in an ON state, for example, a voltage of 5 V, the third photocoupler 81C is turned ON and the first photocoupler 81A and the second photocoupler 81B are turned OFF. Moreover, as the fourth photocoupler 81D and the fifth photocoupler 81E are driven by the driving circuit 50, the bidirectional switch becomes in a conduction state in which a bidirectional current flows between the first terminal 31 and the second terminal 32.

With the above-described configuration, the first power supply 72A and the second power supply 72B do not have to be used as variable power supply. A resistance element R6 and a resistance element R7 are protective resistances for LEDs of the photocouplers. When a forward direction voltage and a forward direction current of the LED are 3.6 V and 20 mA, respectively, and a driving voltage is 5 V, for example, a resistance value of the resistance element R6 may be 70 Ω and a resistance value of the resistance element R7 may be 35 Ω. Moreover, the driving circuit 50 of FIG. 2 may be used.

Modified Example of Third Embodiment

Hereafter, a modified example of the third embodiment of the present invention will be described. A circuit configuration of a bidirectional switch of this modified example is substantially the same as the bidirectional switch of the third embodiment of FIG. 11, except that the FET 10 is a normally-on FET. In this modified example, for example, a FET of which a threshold voltage is −2 V is used and an output voltage of each of the first power supply 72A and the second power supply 72B is a voltage lower than the threshold voltage, for example, a voltage of −5 V in order to make the bidirectional switch in a cut-off state.

The operation of the bidirectional switch of this modified embodiment is as follows. First, when the bidirectional switch is intended to be in a cut-off state, the first switch 71A and the second switch 71B are turned OFF and the third switch 71C is turned ON. Furthermore, assume that the potential of the second terminal 32 is higher than the potential of the first terminal 31. For example, if the potential of the second terminal 32 is +100 V with respect to the potential of the first terminal 31, the fourth switch 71D is turned ON and the fifth switch 71E is turned OFF. In this case, since a voltage lower than the threshold voltage of the FET 10, i.e., a voltage of −5 V is applied between the first ohmic electrode 16 and the gate electrode 18 by the first power supply 72A, a current flowing from the second ohmic electrode 17 to the first ohmic electrode 16 can be cut off.

On the other hand, assume that the potential of the second terminal 32 is lower than the potential of the first terminal 31. For example, if the potential of the second terminal 32 is −100 V with respect to the potential of the first terminal 31, the fourth switch 71D is turned OFF and the fifth switch 71E is turned ON. In this case, since a voltage lower than the threshold voltage of the FET 10, i.e., a voltage of −5 V is applied between the second ohmic electrode 17 and the gate electrode 18 by the second power supply 72B, a current flowing from the first ohmic electrode 16 to the second ohmic electrode 17 can be cut off.

Next, when the bidirectional switch is intended to be in a conduction state, the first switch 71A and the second switch 71B are turned ON and the third switch 71C is turned OFF. The fourth switch 71D performs the same operation as the operation of the first switch of the first embodiment and the fifth switch 71E performs the same operation of the second switch of the first embodiment.

When the potential of the first ohmic electrode 16 is higher than the potential of the second ohmic electrode 17, a higher voltage than the threshold voltage, i.e., a voltage of 0 V is applied between the first ohmic electrode 16 and the gate electrode 18 and a current can be made to flow from the second ohmic electrode 17 to the first ohmic electrode 16.

Moreover, to apply a normally-on FET to the circuit of FIG. 12, in FIG. 12, the inverter 85 is connected between the gate driving signal source 91 and the resistance element R6. The gate driving signal source 91 and the resistance element R7 are directly connected to each other. Moreover, an output voltage of each of the first power supply 72A and the second power supply 72B is a voltage lower than the threshold voltage, for example, a voltage of –5 V.

With the above-described configuration, in order to turn the bidirectional switch OFF, for example, when the gate driving signal becomes 0 V, the first photocoupler 81A and the second photocoupler 81B are turned OFF and the third photocoupler 81C is turned ON. Since the fourth photocoupler 81D and the fifth photocoupler 81E perform the same operation as the operation of the circuit of the third embodiment, a voltage lower than the threshold voltage, i.e., a voltage of –5 V is applied between the first ohmic electrode 16 and the gate electrode 18 when the potential of the second ohmic electrode 17 is higher than the potential of the first ohmic electrode 16, so that a current flowing from the second ohmic electrode 17 to the first ohmic electrode 16 can be cut off. When the potential of the second ohmic electrode 17 is lower than the potential of the first ohmic electrode 16, a voltage lower than the threshold voltage, i.e., a voltage of –5 V is applied between the second ohmic electrode 17 and the gate electrode 18 and a current flowing from the first ohmic electrode 16 to the second ohmic electrode 17 can be cut off.

In order to turn the bidirectional switch ON, for example, when the gate driving signal becomes 5 V, the first photocoupler 81A and the second photocoupler 81B are turned ON and the third photocoupler 81C is turned OFF. The fourth photocoupler 81D and the fifth photocoupler 81E perform the same operation as the operation described in the third embodiment. In this case, in the same manner as in the cut-off state described in the third embodiment, a potential equal to the potential of the first ohmic electrode 16 or the second ohmic electrode 17 is given to the gate electrode 18 by the potential of the first ohmic electrode 16, the potential of the second ohmic electrode 17, the first diode 73A, the second diode 73B and the third diode 73C. As a result, a bidirectional current can be conductive.

The third switch 71C is connected to the gate electrode 18 via the third diode 73C. However, as long as a bidirectional current can be controlled, the third switch 71C may be directly connected to the gate electrode 18.

In each of the embodiments, an example where the first ohmic electrode 16 is grounded has been described. However, if all grounded terminals in the control circuit 20 are connected to the first ohmic electrode 16, the first ohmic electrode 16 does not have to be grounded. Moreover, the bidirectional power supply 41 in each embodiment is an alternating current source, but may be a circuit which can conduct a bidirectional current. For example, a circuit including a capacitance and an inductance may be used.

When the potential of the first ohmic electrode 16 is equal to the potential of the second ohmic electrode 17, a bidirectional current does not flow between the first ohmic electrode 16 and the second ohmic electrode 17 and thus allocation of a bias voltage to the gate electrode 18 is not necessary. Therefore, when the potential of the first ohmic electrode 16 is equal to the potential of the second ohmic electrode 17, each switch may be in any state.

Instead of the Si substrate illustrated in each of the first through third embodiments, a GaN substrate, a sapphire substrate, a SiC substrate or the like may be used. In such a case, for example, a FET is preferably formed on a representative surface such as a (0001) surface or the like. As long as desired transistor properties of a field-effect transistor can be realized, a transistor may be formed on a substrate surface having an off angle from a representative surface such as a (0001) surface or the like. Furthermore, the composition ratio, lamination structure and the like of nitride semiconductor may be arbitrarily modified.

As has been described, according to the present invention, a bidirectional switch which can control a current flowing from a first ohmic electrode to a second ohmic electrode and a current flowing from the second ohmic electrode to the first ohmic electrode to make a current flow at least in one direction and cut off a bidirectional current can be realized. Thus, the bidirectional switch of the present invention is useful as a bidirectional switch of a power circuit used for a plasma display, a bidirectional switch used for a motor drive circuit using a matrix converter circuit, a bidirectional switch for power control, or the like.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A bidirectional switch for controlling between a conduction state in which a current flows at least in one direction between a first terminal and a second terminal and a cut-off state in which a current does not flow therebetween, the switch comprising:
   a field-effect transistor including a first ohmic electrode and a second ohmic electrode of which one serves as a source electrode and the other serves as a drain electrode and a gate electrode formed between the first ohmic electrode and the second ohmic electrode, the first ohmic electrode being connected to the first terminal, the second ohmic electrode being connected to the second terminal; and
   a control circuit for applying a bias voltage to the gate electrode to control between the conduction state and the cut-off state,
   wherein the control circuit applies the bias voltage with reference to the first ohmic electrode when a potential of the second ohmic electrode is higher than the potential of the first ohmic electrode and applies the bias voltage with reference to the second ohmic electrode when the potential of the second ohmic electrode is lower than the potential of the first ohmic electrode.

2. The bidirectional switch of claim 1, wherein the control circuit includes a first power supply,
   electrically connects, when the potential of the second ohmic electrode is higher than the potential of the first ohmic electrode, the first power supply between the first ohmic electrode and the gate electrode to apply the bias voltage to the gate electrode, and
   electrically connects, when the potential of the second ohmic electrode is lower than the potential of the first ohmic electrode, the first power supply between the second ohmic electrode and the gate electrode to apply the bias voltage to the gate electrode.

3. The bidirectional switch of claim 2, wherein the control circuit includes a first switch connected between the first power supply and the first ohmic electrode, a second switch connected between the first power supply and the second ohmic electrode and a driving circuit for driving the first switch and the second switch, and the driving circuit switches, on the basis of a result of comparison of the potential of the first ohmic electrode with the potential of the second ohmic electrode, between an ON state and an OFF state of each of the first switch and the second switch.

4. The bidirectional switch of claim 1, wherein the control circuit includes a first power supply and a second power supply, electrically connects, when the potential of the second ohmic electrode is higher than the potential of the first ohmic electrode, the first power supply between the first ohmic electrode and the gate electrode to apply the bias voltage to the gate electrode, and electrically connects, when the potential of the second electrode is lower than the potential of the first ohmic electrode, the second power supply between the second ohmic electrode and the gate electrode to apply the bias voltage to the gate electrode.

5. The bidirectional switch of claim 4, wherein each of the first power supply and the second power supply outputs a higher voltage than a threshold voltage of the field-effect transistor in the conduction state, and outputs a lower voltage than the threshold voltage of the field-effect transistor in the cut-off state.

6. The bidirectional switch of claim 4, wherein the first power supply outputs a higher voltage than a threshold voltage of the field-effect transistor and the second power supply outputs a lower voltage than the threshold voltage of the field-effect transistor to make a current flow in one direction and cut off a current in the other direction between the first terminal and the second terminal.

7. The bidirectional switch of claim 4, wherein the control circuit includes a first switch connected between the first power supply and the gate electrode, a second switch connected between the second power supply and the gate electrode and a driving circuit for driving the first switch and the second switch, and the driving circuit switches, on the basis of a result of comparison of the potential of the first ohmic electrode with the potential of the second ohmic electrode, between an ON state and an OFF state of each of the first switch and the second switch.

8. The bidirectional switch of claim 7, wherein the first switch and the second switch are a first photocoupler and a second photocoupler, respectively, the driving circuit includes an differential amplifier for receiving a voltage corresponding to a voltage applied between the first ohmic electrode and the second ohmic electrode at an input terminal, and the differential amplifier drives a light emitting diode of the first photocoupler and a light emitting diode of the second photocoupler.

9. The bidirectional switch of claim 7, wherein the first switch and the second switch are a first photocoupler and a second photocoupler, respectively, the driving circuit includes a first differential amplifier for receiving a voltage corresponding to a voltage applied between the first ohmic electrode and the second ohmic electrode at a non-inverting input terminal and a second differential amplifier for receiving a voltage corresponding to a voltage applied between the first ohmic electrode and the second ohmic electrode at an inverting input terminal, the first differential amplifier having an inverting input terminal connected to the first ohmic electrode, the second differential amplifier having a non-inverting input terminal connected to the first ohmic electrode, the first differential amplifier drives the light emitting diode of the first photocoupler, and the second differential amplifier drives the light emitting diode of the second photocoupler.

10. The bidirectional switch of claim 1, wherein the field-effect transistor includes a semiconductor layer formed on a substrate, the first ohmic electrode and the second ohmic electrode are formed on the semiconductor layer so as to be spaced apart from each other, and the gate electrode is formed on the semiconductor layer so that a distance between the first ohmic electrode and the gate electrode and a distance between the second ohmic electrode and the gate electrode are equal.

11. A method for driving a bidirectional switch including a field-effect transistor having a first ohmic electrode and a second ohmic electrode of which one serves as a source electrode and the other serves as a drain electrode and a gate electrode formed between the first ohmic electrode and the second ohmic electrode, the method comprising the steps of:

comparing a potential of the second electrode with a potential of the first ohmic electrode; and applying a bias voltage to a gate electrode of the field-effect transistor with reference to the first ohmic electrode when the potential of the second ohmic electrode is higher than the potential of the first ohmic electrode and applying the bias voltage to the gate electrode with reference to the second ohmic electrode when the potential of the second ohmic electrode is lower than the potential of the first ohmic electrode, wherein the bias voltage is a higher voltage than a threshold voltage of the field-effect transistor in a conduction state in which a current flows at least in one direction between a first terminal and a second terminal and is a voltage lower than the threshold voltage in a cut-off state in which a current does not flow therebetween.

* * * * *